United States Patent
Lin et al.

(10) Patent No.: US 10,084,115 B2
(45) Date of Patent: *Sep. 25, 2018

(54) OPTOELECTRONIC DEVICE AND THE MANUFACTURING METHOD THEREOF

(71) Applicant: EPISTAR CORPORATION, Hsinchu (TW)

(72) Inventors: Chun-Yu Lin, Hsinchu (TW); Yi-Ming Chen, Hsinchu (TW); Shih-Chang Lee, Hsinchu (TW); Yao-Ning Chan, Hsinchu (TW); Tzu-Chieh Hsu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/467,679

(22) Filed: Mar. 23, 2017

(65) Prior Publication Data

US 2017/0194532 A1    Jul. 6, 2017

Related U.S. Application Data

(60) Continuation of application No. 15/176,890, filed on Jun. 8, 2016, now Pat. No. 9,640,728, which is a
(Continued)

(51) Int. Cl.
*H01L 33/00* (2010.01)
*H01L 33/38* (2010.01)
(Continued)

(52) U.S. Cl.
CPC .......... *H01L 33/387* (2013.01); *H01L 33/06* (2013.01); *H01L 33/22* (2013.01); *H01L 33/405* (2013.01);
(Continued)

(58) Field of Classification Search
None
See application file for complete search history.

(56) References Cited

U.S. PATENT DOCUMENTS

| 5,606,572 A | 2/1997 | Swirhun et al. |
| 5,804,836 A | 9/1998 | Heeger et al. |

(Continued)

FOREIGN PATENT DOCUMENTS

| CN | 1510765 A | 7/2004 |
| CN | 101471413 A | 7/2009 |

(Continued)

*Primary Examiner* — Tram H Nguyen
(74) *Attorney, Agent, or Firm* — Muncy, Geissler, Olds & Lowe, P.C.

(57) ABSTRACT

The present disclosure provides an optoelectronic device comprising a semiconductor stack comprising a first side having a first length; a first contact layer on the semiconductor stack; and a second contact layer on the semiconductor stack opposite to the first contact layer, wherein the second contact layer is not overlapped with the first contact layer in a vertical direction; and wherein the second contact layer comprises multiple contact regions separated from each other and arranged in a two-dimensional array, wherein a first distance between the two adjacent contact regions is between 0.8% and 8% of the first length.

20 Claims, 22 Drawing Sheets

Related U.S. Application Data continuation-in-part of application No. 14/852,212, filed on Sep. 11, 2015, now Pat. No. 9,385,272, which is a continuation of application No. 14/489,169, filed on Sep. 17, 2014, now Pat. No. 9,136,436, which is a continuation-in-part of application No. 13/932,661, filed on Jul. 1, 2013, now Pat. No. 9,006,774, which is a continuation-in-part of application No. 13/528,059, filed on Jun. 20, 2012, now Pat. No. 8,474,233, which is a division of application No. 13/021,307, filed on Feb. 4, 2011, now Pat. No. 8,207,550.

(60) Provisional application No. 61/302,662, filed on Feb. 9, 2010.

(51) Int. Cl.
| | | |
|---|---|---|
| *H01L 33/22* | (2010.01) | |
| *H01L 33/40* | (2010.01) | |
| *H01L 33/06* | (2010.01) | |
| *H01L 33/42* | (2010.01) | |
| *H01L 33/44* | (2010.01) | |

(52) U.S. Cl.
CPC .............. *H01L 33/42* (2013.01); *H01L 33/44* (2013.01); *H01L 2933/0016* (2013.01); *H01L 2933/0025* (2013.01)

(56) References Cited

U.S. PATENT DOCUMENTS

| | | | |
|---|---|---|---|
| 6,097,041 A | 8/2000 | Lin et al. | |
| 6,614,056 B1 * | 9/2003 | Tarsa | ...................... H01L 33/20 257/773 |
| 7,019,323 B2 | 3/2006 | Shakuda et al. | |
| 7,564,071 B2 | 7/2009 | Konno | |
| 7,692,203 B2 | 4/2010 | Konno | |
| 8,207,550 B2 | 6/2012 | Chen et al. | |
| 8,232,567 B2 | 7/2012 | Dai et al. | |
| 8,368,102 B2 | 2/2013 | Fujimoto et al. | |
| 8,809,894 B2 * | 8/2014 | Nakano | ................... H01L 33/46 257/103 |
| 9,640,728 B2 * | 5/2017 | Lin | ....................... H01L 33/387 |
| 2002/0079500 A1 | 6/2002 | Liu et al. | |
| 2003/0001162 A1 | 1/2003 | Udagawaa | |
| 2004/0075095 A1 | 4/2004 | Shakuda et al. | |
| 2004/0211972 A1 | 10/2004 | Du et al. | |
| 2005/0142379 A1 | 6/2005 | Juni et al. | |
| 2005/0230701 A1 | 10/2005 | Huang | |
| 2005/0236636 A1 | 10/2005 | Hon et al. | |
| 2007/0176546 A1 | 8/2007 | Hsieh et al. | |
| 2009/0039366 A1 | 2/2009 | Chiu | |
| 2009/0108286 A1 | 4/2009 | Lin et al. | |
| 2009/0218941 A1 | 9/2009 | Nakamura et al. | |
| 2009/0275154 A1 | 11/2009 | Suzuki et al. | |
| 2009/0278164 A1 | 11/2009 | Osawa et al. | |
| 2010/0078659 A1 | 4/2010 | Iizuka et al. | |
| 2010/0218819 A1 | 9/2010 | Farmer et al. | |
| 2010/0237357 A1 | 9/2010 | Tsai et al. | |
| 2011/0024781 A1 | 2/2011 | Fujimoto | |
| 2011/0101404 A1 | 5/2011 | Fu et al. | |
| 2011/0108879 A1 | 5/2011 | Huang et al. | |
| 2011/0127551 A1 | 6/2011 | Pan et al. | |
| 2013/0032846 A1 | 2/2013 | Lin | |
| 2014/0001508 A1 | 1/2014 | Tasaki et al. | |
| 2016/0005917 A1 | 1/2016 | Jung et al. | |

FOREIGN PATENT DOCUMENTS

| | | |
|---|---|---|
| CN | 201340857 Y | 11/2009 |
| EP | 0789430 B1 | 2/2000 |
| JP | 2001-036129 A | 2/2001 |
| JP | 2004-207441 A | 7/2004 |
| JP | 2004349584 | 12/2004 |
| JP | 2006-339294 A | 12/2006 |
| JP | 2008-4587 A | 1/2008 |
| JP | 2008-166678 A | 7/2008 |
| JP | 2009-088521 A | 4/2009 |
| JP | 2009-130097 A | 6/2009 |
| KR | 10-2009-0017200 A | 2/2009 |
| WO | PCT/JP2006/303344 | 8/2006 |
| WO | WO 2007/015330 A1 | 2/2007 |

\* cited by examiner

OPTOELECTRONIC DEVICE AND THE MANUFACTURING METHOD THEREOF

RELATED APPLICATION DATA

This application is a continuation application of U.S. patent application Ser. No. 15/176,890, filed on Jun. 8, 2016, which is a continuation in-part application of U.S. patent application Ser. No. 14/852,212, filed on Sep. 11, 2015, now U.S. Pat. No. 9,385,272, which is a continuation application of U.S. patent application Ser. No. 14/489,169, filed Sep. 17, 2014, now U.S. Pat. No. 9,136,436, which is a continuation in-part application of U.S. patent application Ser. No. 13/932,661, filed Jul. 1, 2013, now U.S. Pat. No. 9,006,774, now U.S. Pat. No. 8,474,233, which is a continuation in-part application of U.S. patent application Ser. No. 13/528,059, filed Jun. 20, 2012, now U.S. Pat. No. 8,474,233, which is a continuation application of U.S. patent application Ser. No. 13/021,307, filed Feb. 4, 2011, now U.S. Pat. No. 8,207,550, the contents of which are hereby incorporated by reference in their entireties.

TECHNICAL FIELD

The application relates to an optoelectronic device and the manufacturing method thereof.

DESCRIPTION OF RELATED ART

Recently, efforts have been put to promote the luminous efficiency of the light-emitting diode (LED) in order to implement the device in the lighting field, and further conserve the energy and reduce carbon emission. The LED luminous efficiency can be increased through several aspects. One is to increase the internal quantum efficiency (IQE) by improving the epitaxy quality to enhance the combination efficiency of electrons and holes. Another is to increase the light extraction efficiency (LEE) that emphasizes on the increase of light which is emitted by the light-emitting layer capable of escaping outside the device, and therefore reducing the light absorbed by the LED structure.

SUMMARY

The present disclosure provides an optoelectronic device comprising a substrate comprising a first side having a first length; a first contact layer on the substrate; and a second contact layer between the substrate and the first contact layer, wherein the second contact layer is not overlapped with the first contact layer in a vertical direction; and wherein the second contact layer comprises multiple contact regions separated from each other and arranged in a two-dimensional array, wherein a first distance between the two adjacent contact regions is between 0.8% and 8% of the first length.

DETAILED DESCRIPTION OF PREFERRED EMBODIMENTS

Figure 1A:
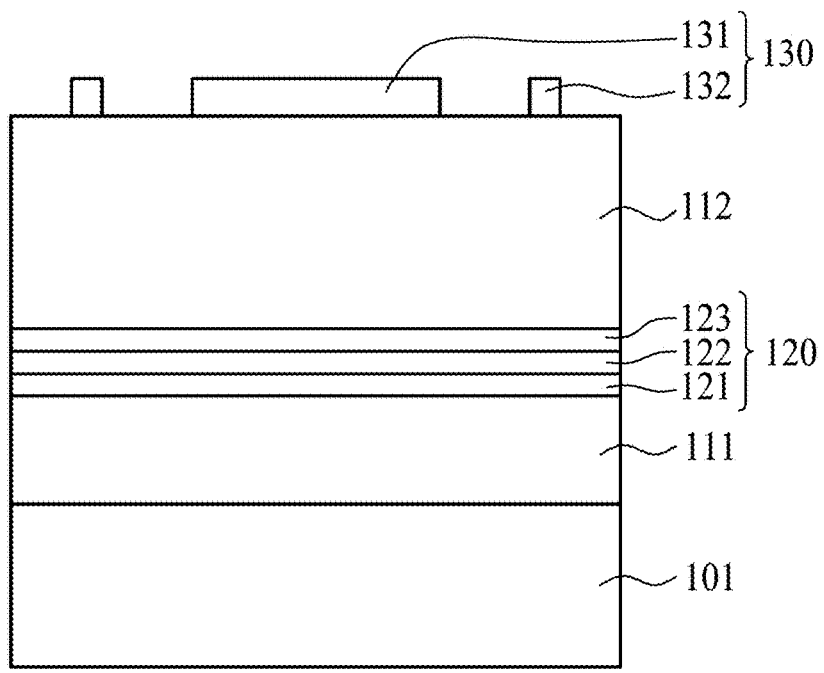
FIGS. 1A to 1H illustrate the corresponding structures fabricated by the manufacturing method step-by-step in accordance with the first embodiment of the present disclosure.

FIGS. 1A to 1H show the corresponding structures fabricated by the manufacturing method step-by-step according to one embodiment of the present disclosure. With reference to FIG. 1A, the method for manufacturing an optoelectronic device in accordance with the present disclosure comprises a step of providing a substrate 101, such as a growth substrate for growing or carrying an optoelectronic system 120, and the material for the substrate 101 includes but is not limited to germanium (Ge), gallium arsenide (GaAs), indium phosphide (InP), gallium phosphide (GaP), sapphire, silicon carbide (SiC), silicon (Si), lithium aluminum oxide (LiAlO$_2$), zinc oxide (ZnO), gallium nitride (GaN), aluminum nitride (AlN), glass, composite, diamond, CVD diamond, diamond-like carbon (DLC), and so on.

A first window layer 111 is formed on the substrate 101 made of a material containing at least one element selected from the group consisting of Al, Ga, In, As, P, and N, such as GaN, AlGaInP or any other suitable materials. The first window layer 111 is a layer with a conductivity-type, such as n-type or p-type $(Al_xGa_{(1-x)})_{0.5}In_{0.5}P$ where $0.5 \le x \le 0.8$. The first window layer 111 has two opposite surface wherein the first surface of the first window layer 111 is closer to the substrate 101.

A transition layer could be optionally formed between the substrate 101 and the first window layer 111. The transition layer between two material systems can be used as a buffer system. For the structure of the light-emitting diode, the transition layer is used to reduce the lattice mismatch between two material systems. On the other hand, the transition layer could also be a single layer, multiple layers, or a structure to combine two materials or two separated structures where the material of the transition layer can be organic, inorganic, metal, semiconductor, and so on, and the structure can be a reflection layer, a heat conduction layer, an electrical conduction layer, an ohmic contact layer, an anti-deformation layer, a stress release layer, a stress adjustment layer, a bonding layer, a wavelength converting layer, a mechanical fixing structure, and so on.

Next, the optoelectronic system 120 is formed on the second surface of the first window layer 111 including at least a first layer 121 having a first conductivity-type, a conversion unit 122, and a second layer 123 having a second conductivity-type in sequence. The first layer 121 and the second layer 123 are two single-layer structures or two multiple layers structure ("multiple layers" means two or more than two layers) having different conductivities, electrical properties, polarities, and/or dopants for providing electrons or holes respectively. If the first layer 121 and the second layer 123 are composed of semiconductor materials, such as $(Al_xGa_{(1-x)})_{0.5}In_{0.5}P$ where $0.5 \leq x \leq 0.8$, the first or second conductivity-type can be p-type or n-type. The first window layer 111 has the same conductivity-type as the first layer 121, such as n-type. Besides, the first window layer 111 has greater impurity concentration than the first layer 121 to have a better conductivity. The conversion unit 122 disposed between the first layer 121 and the second layer 123 is a region where the light energy and the electrical energy could transfer or could be induced to transfer. The optoelectronic system 120, such as applied to a semiconductor device, equipment, product, circuit, can proceed or induce the light energy and electrical energy transfer. Specifically speaking, the optoelectronic system includes at least one of a light-emitting diode (LED), a laser diode (LD), a solar cell, a liquid crystal display, or an organic light-emitting diode. The optoelectronic system having the conversion unit 122 transferring the electrical energy to the light energy is a light-emitting diode, a liquid crystal display, or an organic light-emitting diode. The optoelectronic system having the conversion unit 122 transferring the light energy to the electrical energy is a solar cell or an optoelectronic diode. The phrase "optoelectronic system" in the specification does not require that all the sub-systems or units in the system manufactured by semiconductor materials. Other non-semiconductor materials such as metal, oxide, insulator, and so on could also be selectively integrated in this optoelectronic system 120.

Taking the light-emitting diode as an example, the emission spectrum of the transferred light could be adjusted by changing the physical or chemical arrangement of one layer or more layers in the optoelectronic system 120. The commonly used materials are the series of aluminum gallium indium phosphide (AlGaInP), the series of aluminum gallium indium nitride (AlGaInN), the series of zinc oxide (ZnO), and so on. The conversion unit 122 can be a single heterostructure (SH) structure, a double heterostructure (DH) structure, a double-side double heterostructure (DDH) structure, or a multi-quantum well (MWQ) structure. Specifically, the conversion unit 122 comprises a MQW structure comprising a plurality of barrier layers and well layers alternately stacked, each of the barrier layers comprises $(Al_yGa_{(1-y)})_{0.5}In_{0.5}P$ where $0.5 \leq y \leq 0.8$; and each of the well layers comprises $In_{0.5}Ga_{0.5}P$. Besides, the wavelength of the emitted light could also be adjusted by changing the number of the pairs of the quantum well or the composition of the barrier layer, e.g. the emitted light is red light with dominant wavelength between 600 and 630 nm by having y around 0.7 or amber light with dominant wavelength between 580 and 600 nm by having y around 0.55.

Figure 3:
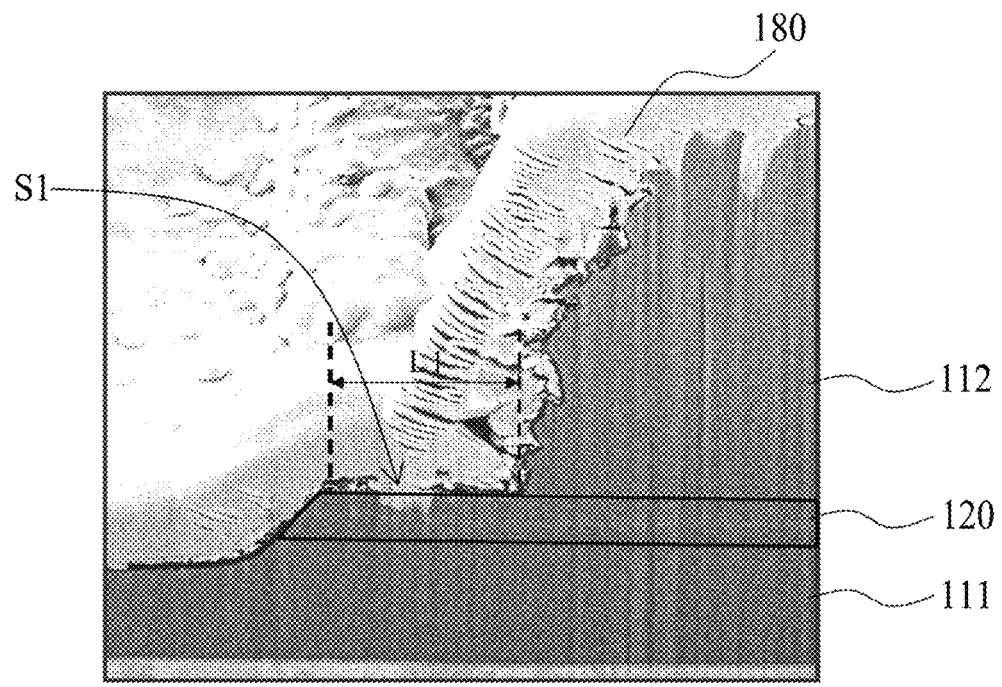
FIG. 3 illustrates an SEM photograph of the optoelectronic device in FIG. 2 in accordance with the present disclosure.

Forming a second window layer 112 on a first surface of the optoelectronic system 120 whose material contains at least one element selected from the group consisting of Al, Ga, In, As, P, and N, such as GaN, AlGaInP or any other suitable materials, and the second window layer 112 comprises at least one material different from the optoelectronic system 120 or the second layer 123. The second window layer 112 is preferred a layer with a conductivity-type the same as the second layer 123, such as a p-type GaP layer. In another embodiment, the sidewall of the second window layer 112 and/or the semiconductor system 120 need not be orthogonal to the substrate, but rather may be oblique thereto as indicated in FIG. 3.

Figure 4:
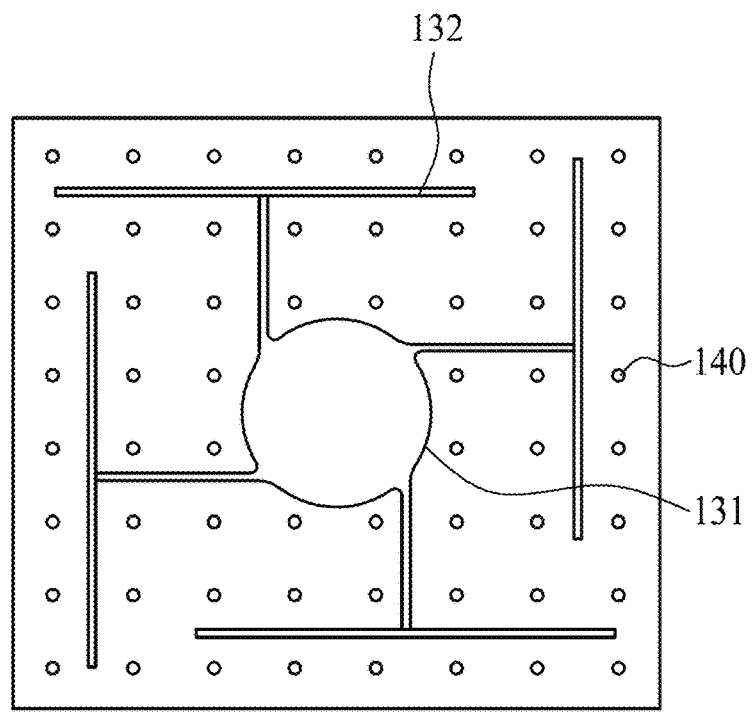
FIG. 4 illustrates a top view of the first ohmic contact layer and the second ohmic contact layer 140 in FIG. 2.

Then, forming a first ohmic contact layer 130 formed by conductive material such as BeAu or GeAu alloy on the second window layer 112, and therefore forming a first stack structure 10 as shown in FIG. 1A, wherein the first ohmic contact layer 130 comprises a plurality of fingers 132 extending toward borders of the first stack structure 10 as shown in FIG. 4. A first alloying process is then performed at an alloying temperature of around 300~500° C. or more for forming an ohmic contact between the first ohmic contact layer 130 and the second window layer 112. The detail of the alloying process is well-known for those skilled in this field, and not necessarily disclosed herein.

Figure 1B:
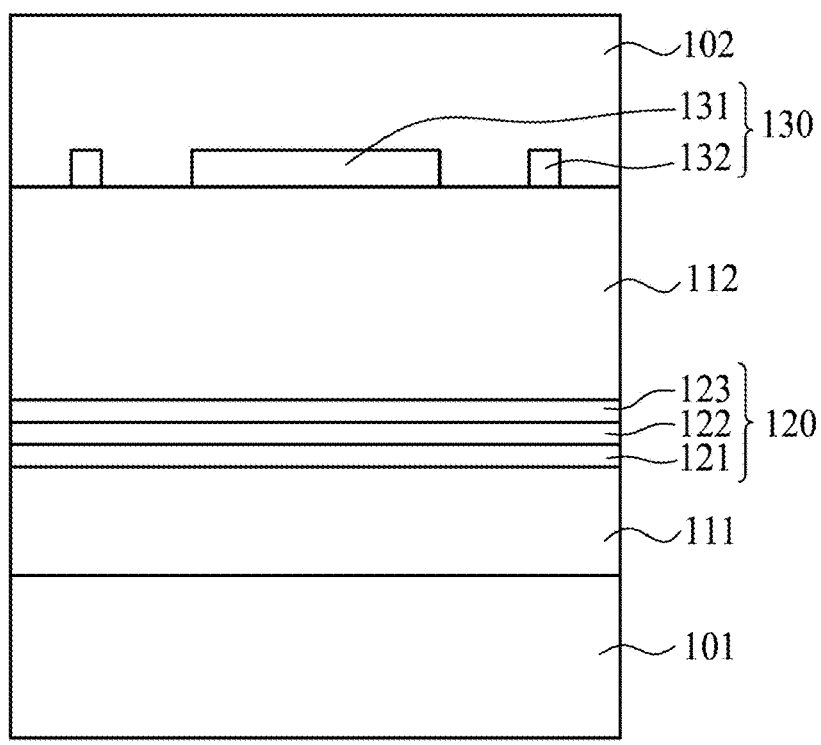
Figure 1C:
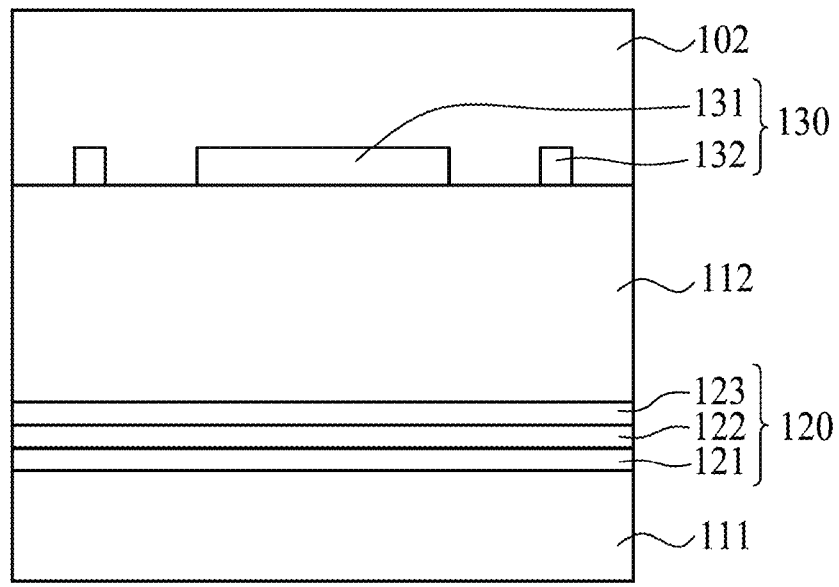

Next, bonding a temporary substrate 102 formed by supportive material such as glass to the first ohmic contact layer 130 and the second window layer 112 of the first stack structure 10 as shown in FIG. 1B, and removing the substrate 101, and therefore exposing the first surface of the first window layer 111 as shown in FIG. 1C.

Figure 1D:
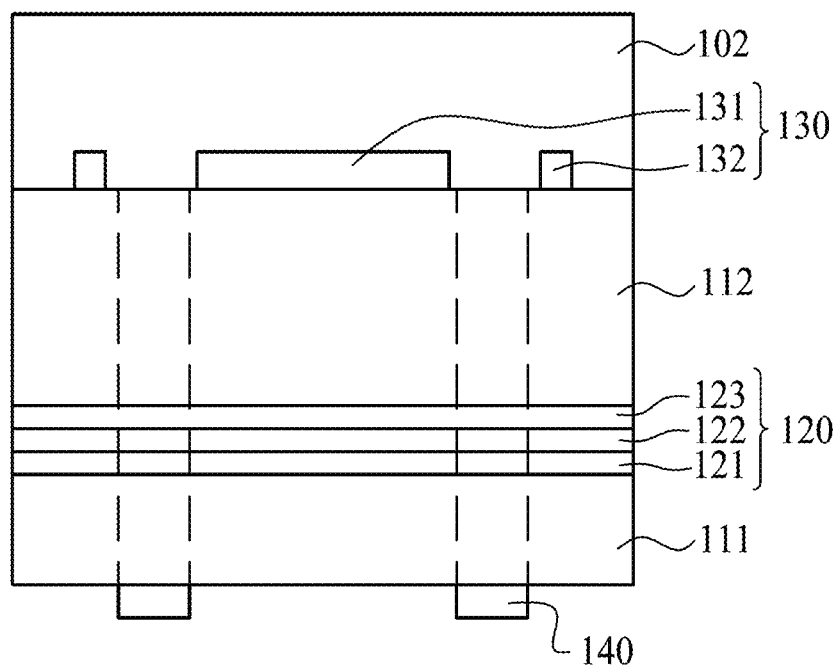

Next, forming a second ohmic contact layer 140 formed by conductive material like GeAu or BeAu alloy on the first surface of the first window layer 111, and therefore forming a second stack structure as shown in FIG. 1D, wherein the second ohmic contact layer 140 comprises a plurality of dots that are arranged in a two-dimensional array and is preferred substantially do not overlap with the first ohmic contact layer 130 in vertical direction as shown in FIG. 1D and for better current spreading effect. A second alloying process is then performed at an alloying temperature of around 300~500° C. or more for forming an ohmic contact between the second ohmic contact layer 140 and the first window layer 111. The detail of the alloying process is well-known for those skilled in this field, and not necessarily disclosed herein.

Next, a transparent conductive layer 141 is sequentially formed by e-beam or sputtering to cover the second ohmic contact layer 140, wherein the material of the transparent conductive layer 141 comprises metal oxide, such as at least one material selected from the group consisting of indium tin oxide (ITO), cadmium tin oxide (CTO), antimony tin oxide, indium zinc oxide, zinc aluminum oxide, and zinc tin oxide; and the thickness is about 0.005 μm~0.6 μm, 0.005 μm~0.5 μm, 0.005 μm~0.4 μm, 0.005 μm~0.3 μm, 0.005 μm~0.2 μm, 0.2 μm~0.5 μm, 0.3 μm~0.5 μm, 0.4 μm~0.5 μm, 0.2 μm~0.4 μm, or 0.2 μm~0.3 μm.

Figure 1E:
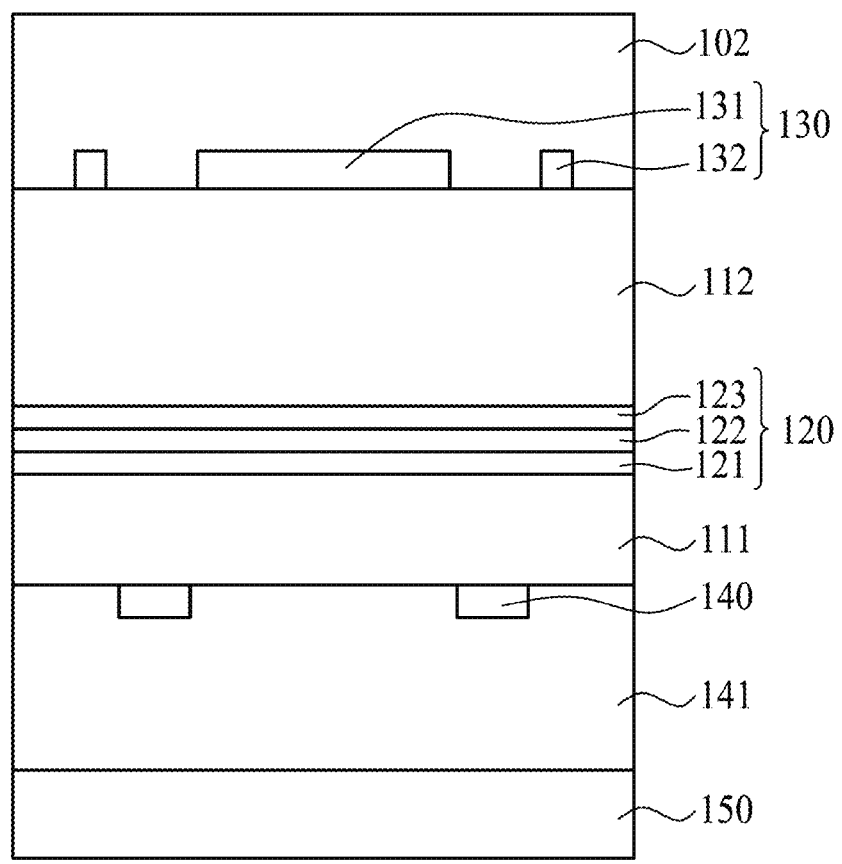
Figure 1F:
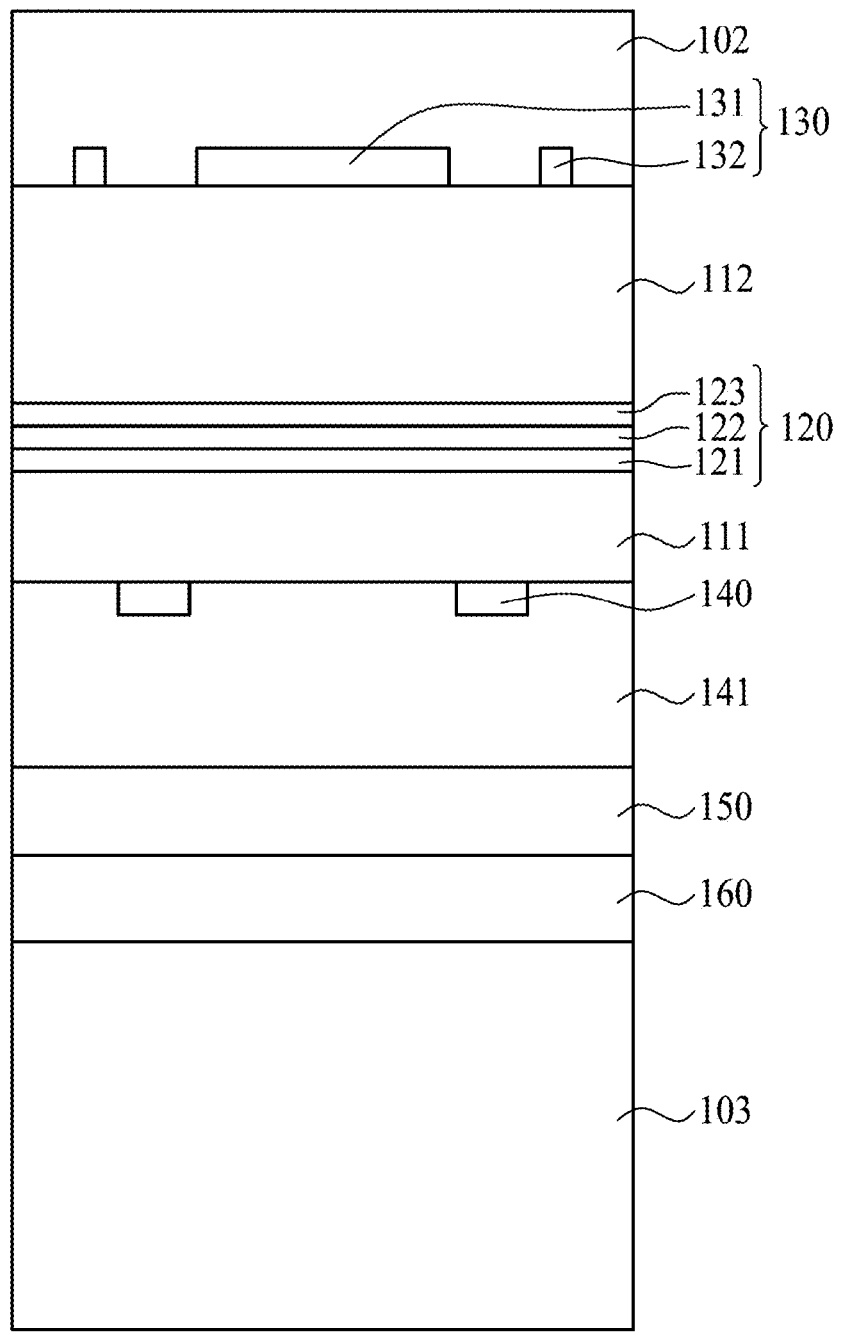

Next, a reflecting layer 150 is formed with a conductive material comprising metal, such as Ag, on the transparent conductive layer 141 as shown in FIG. 1E, and then the reflecting layer 150 is bonded to a supporting substrate 103 by a metal layer 160 as shown in FIG. 1F. In this embodiment, the supporting substrate 103 comprises Si, and the metal layer 160 served as a bonding layer comprises at least one material selected from the group consisting of In, Au, Sn, Pb, InAu, SnAu, and the alloy thereof.

Figure 1G:
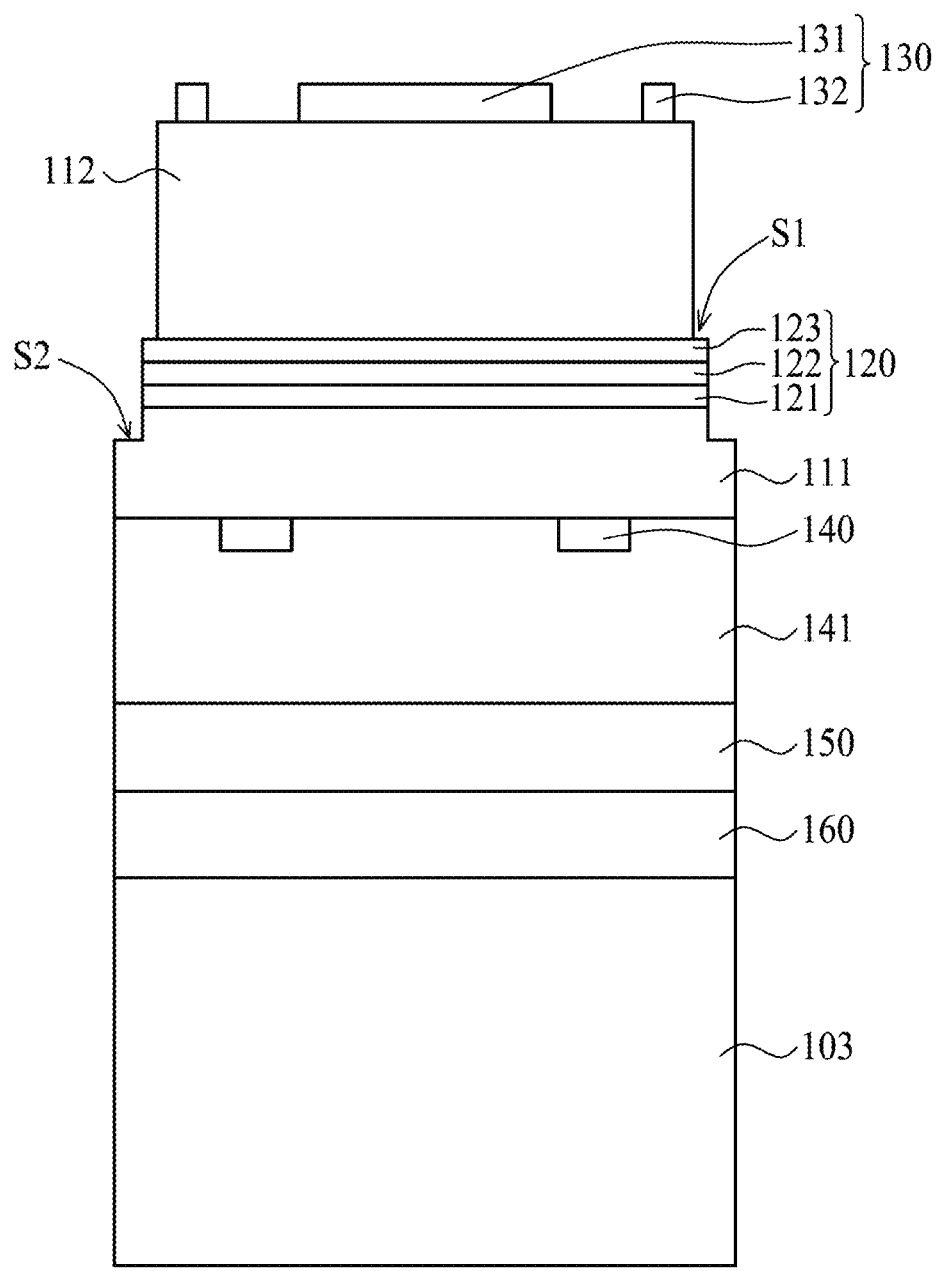

Next, the temporary substrate 102 is removed to expose the first ohmic contact layer 130 and the second window layer 112, and therefore forming a third stack structure. Then the third stack structure is patterned by the lithographic-etching process to form a plurality of chip areas (not shown) on the supporting substrate 103, wherein the etchants of the etching process, e.g. dry-etching chemicals comprising fluoride or chloride etch the second window layer 112 relatively faster than the optoelectronic system 120 such that a first mesa region S1 is formed on the surface of the optoelectronic system 120 or the second layer 123, and the width of the optoelectronic system 120 or the second layer 123 is larger than the width of the second window layer 112 at the interface of the optoelectronic system 120 or the second layer 123 and the second window layer 112 as indicated in FIG. 1G. It can also be noted that a second mesa region S2 is formed on the surface of the first window layer 111, and the bottom width of the first window layer 111 is larger than the optoelectronic system 120 or the first layer 121.

Figure 1H:
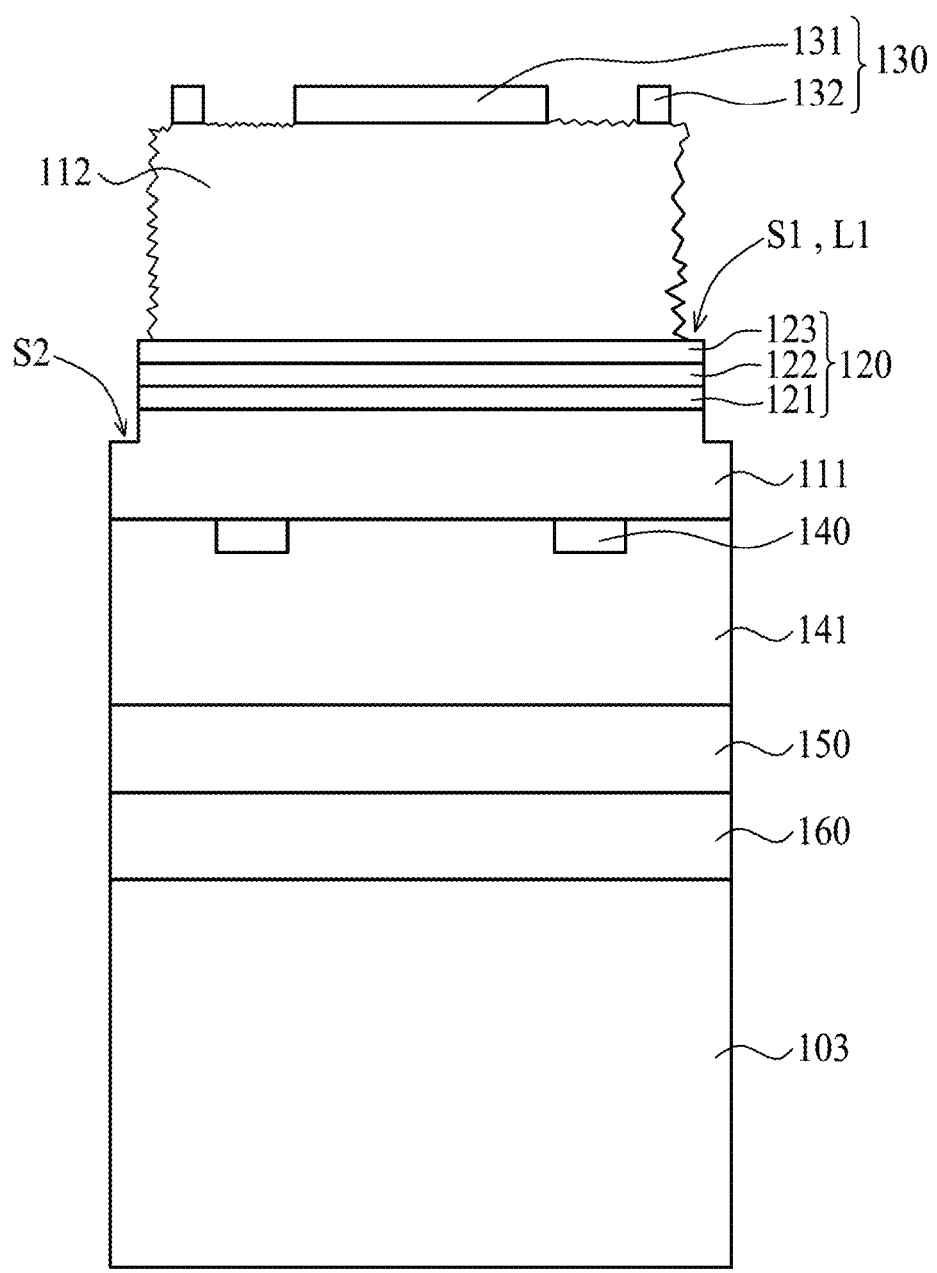

Next, at least the exposed top and sidewall surfaces of the second window layer 112 is wet etched such that the exposed top and sidewall surfaces of the second window layer 112 are roughened, wherein the etching solution, such as a mixture of hydrofluoric acid (HF), nitric acid ($HNO_3$), and acetic acid ($CH_3COOH$), etches the second window layer 112 relatively faster than the optoelectronic system 120 such that the width difference L1 is further expanded and become larger, and the second window layer 112 has an enhanced surface roughness higher than that of the optoelectronic system 120, and wherein the width difference L1 is greater than 1 micron and/or less than 10 microns as indicated in FIG. 1H or FIG. 3.

Figure 2:
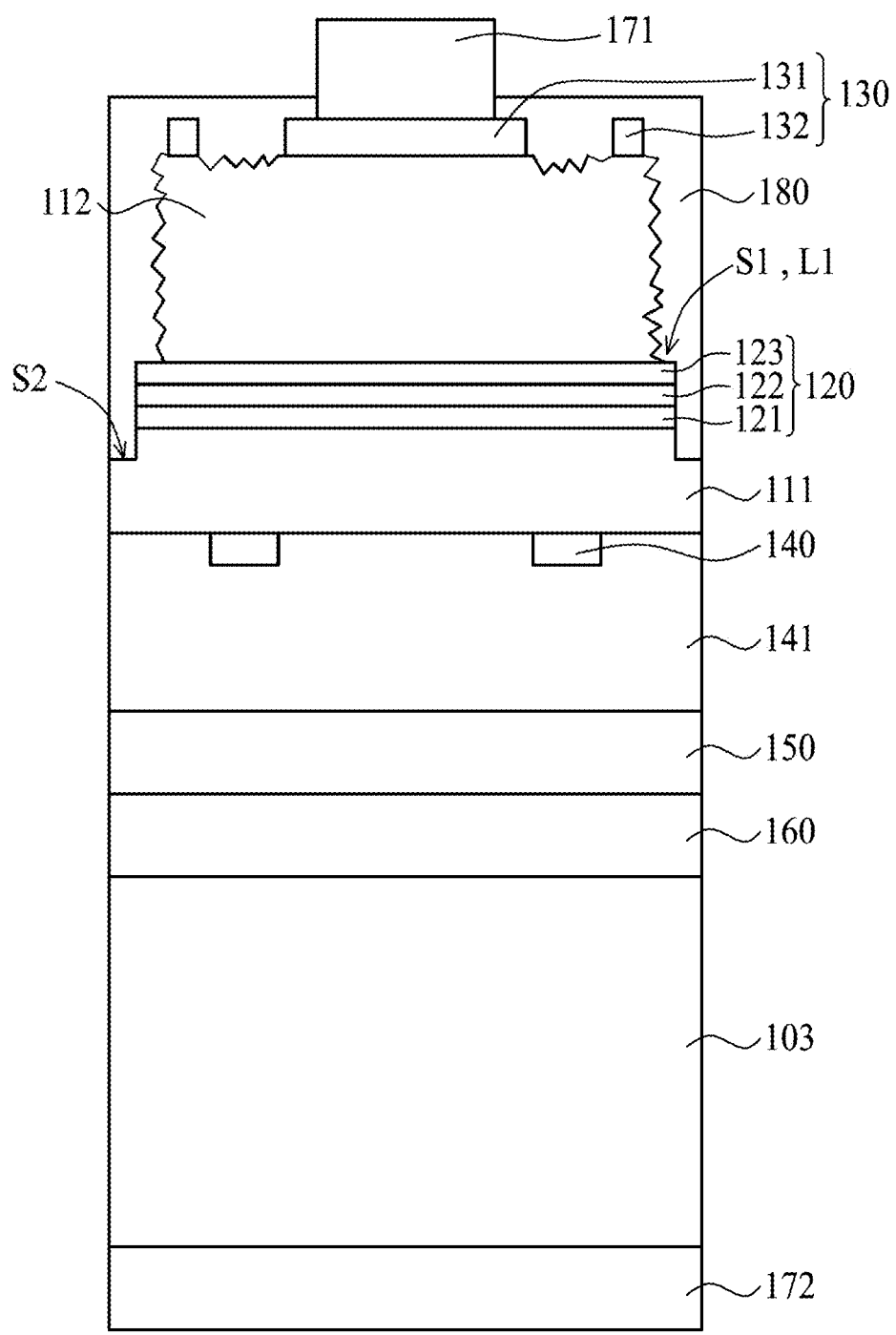
FIG. 2 illustrates an optoelectronic device in accordance with the first embodiment of the present disclosure.

Finally, a first pad 171 is formed on the first ohmic contact layer 130, a second pad 172 is formed on the supporting substrate 103, and a passivation layer 180 covers the second window layer 112 and the first ohmic contact layer 130 to form the optoelectronic device 1a in accordance with the present disclosure as shown in FIG. 2. The passivation layer 180 serves as a protection layer to protect the optoelectronic device 1a from environment damage, such as moisture, or mechanical damage. The SEM photograph of the optoelectronic device 1a according to one embodiment of the present disclosure is demonstrated as in FIG. 3.

According to one embodiment of the present disclosure, the first window layer 111 comprises semiconductor material, such as $(Al_xGa_{(1-x)})_{0.5}In_{0.5}P$ where $0.5 \leq x \leq 0.8$, and the reflecting layer 150 comprising a metal element, e.g. Ag, is formed after the first and second alloying process such that the metal element in the reflecting layer 150 is less diffused into the first window layer 111, where the first window layer 111 comprises a semiconductor material, preferred a material with substantially the same composition as the first layer 121. According to another embodiment of the present disclosure, the atomic concentration of the metal element in the first window layer is less than $1*10^{17}$ $cm^{-3}$ and the atomic concentration of the metal element is greater than $1*10^{16}$ $cm^{-3}$, therefore causing less degradation to the reflecting layer 150. The reflecting layer 150 has a reflectivity greater than 90%.

Table 1 shows the optical efficiencies tested under given conditions by the optoelectronic device of the present disclosure. For an optoelectronic device with a small chip size, such as 10 $mil^2$, the optical efficiency is as high as about 70 lumen/watt under 20 mA or 0.2 $mA/mil^2$ of driving current. For an optoelectronic device with a relative smaller chip size, such as 14 $mil^2$, the optical efficiency is as high as about 100 lumen/watt under 20 mA or 0.1 $mA/mil^2$ of driving current. For an optoelectronic device with a relative larger chip size, such as 28 $mil^2$, the optical efficiency is as high as about 106 lumen/watt under 250 mA or 0.32 $mA/mil^2$ of driving current. For an optoelectronic device with a large chip size, such as 42 $mil^2$, the optical efficiency is as high as about 121 lumen/watt under 350 mA or 0.2 $mA/mil^2$ of driving current. It can be observed from table 1 that the optoelectronic device according to the embodiment of the present disclosure achieves an optical efficiency at least 70 lumen/watt, or preferred at least 100 lumen/watt at a driving current density ranging from 0.1~0.32 $mA/mil^2$.

TABLE 1 the optical efficiencies tested under given conditions according to the optoelectronic device of the present disclosure.

| Chip size [$mil^2$] | Operating current [mA] | Current density [$mA/mil^2$] | Optical efficiency [lumen/watt] | Dominant wavelength [nm] |
| --- | --- | --- | --- | --- |
| 10 | 20 | 0.2 | ~70 | ~620 |
| 14 | 20 | ~0.1 | ~90 | ~620 |
| 28 | 250 | ~0.32 | ~106 | ~613 |
| 42 | 350 | ~0.2 | ~121 | ~613 |

According to the present disclosure, the sheet resistance of the first window layer 111 is higher than that of the second window layer 112. Also, the second ohmic contact layer 140 substantially does not overlap with the first ohmic contact layer 130 in vertical direction. Therefore, the driving current is crowding nearby the second ohmic contact layer 140. The light emitted by the optoelectronic device is corresponding to the region of the second ohmic contact layer 140 and is not blocked by the first ohmic contact layer 130, and therefore having the effect of current blocking and benefit to lateral current spreading.

According to another embodiment of the present disclosure, the first window layer 111 comprises a lower impurity concentration than that of the second window layer 112 to have a lower sheet resistance than that of the second window layer 112. According to another embodiment of the present disclosure, the first window layer 111 comprises an n-type impurity with an impurity concentration of around $1 \times 10^{17}$~$5 \times 10^{17}$ $cm^{-3}$, and the second window layer 112 comprises a p-type impurity with an impurity concentration of $1 \times 10^{18}$~$5 \times 10^{18}$ $cm^{-3}$ higher than that of the first window layer 111. According to another embodiment of the present disclosure, the thickness of the first window layer between 1~5 microns is smaller than the thickness of the second window layer 112 between 5~20 microns.

According to one embodiment of the present disclosure, because the sidewall surfaces of the second window layer 112 are roughened, the light can be laterally extracted easily. The chip areas can be rectangle in shape for better luminous efficiency. The ratio of the length to the width of the rectangle is preferred from 1.5:1 to 10:1.

As shown in FIGS. 5A to 5E, a method of manufacturing an optoelectronic device with different structure is disclosed in accordance with one embodiment. The method incorporates the steps as disclosed in FIGS. 1A~1C and the descriptions thereof. The difference between the optoelectronic devices disclosed in FIG. 5E and in FIG. 2 is the structure between the first window layer 111 and metal layer 160.

Figure 5A:
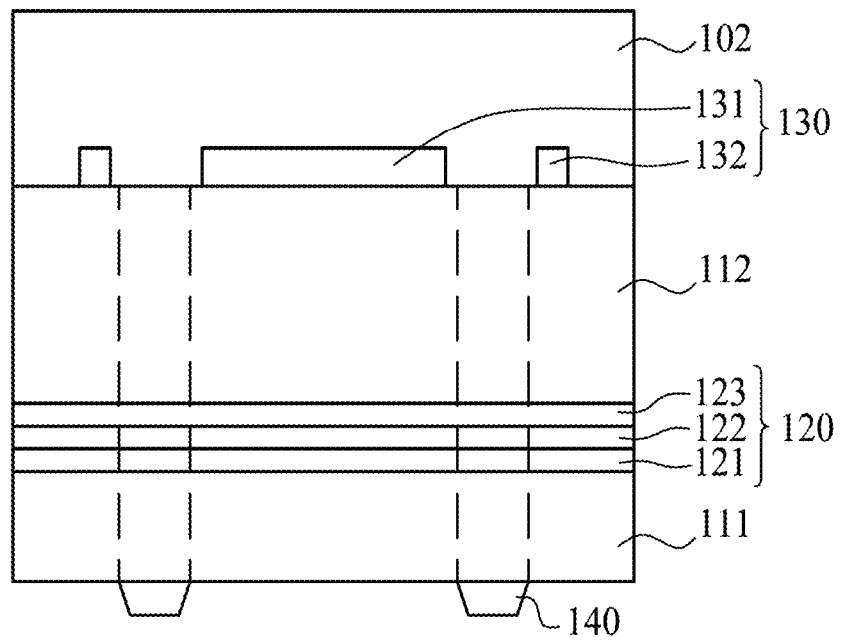
FIGS. 5A to 5E show the corresponding structures fabricated by the manufacturing method step-by-step in accordance with the second embodiment of the present disclosure.
Figure 6:
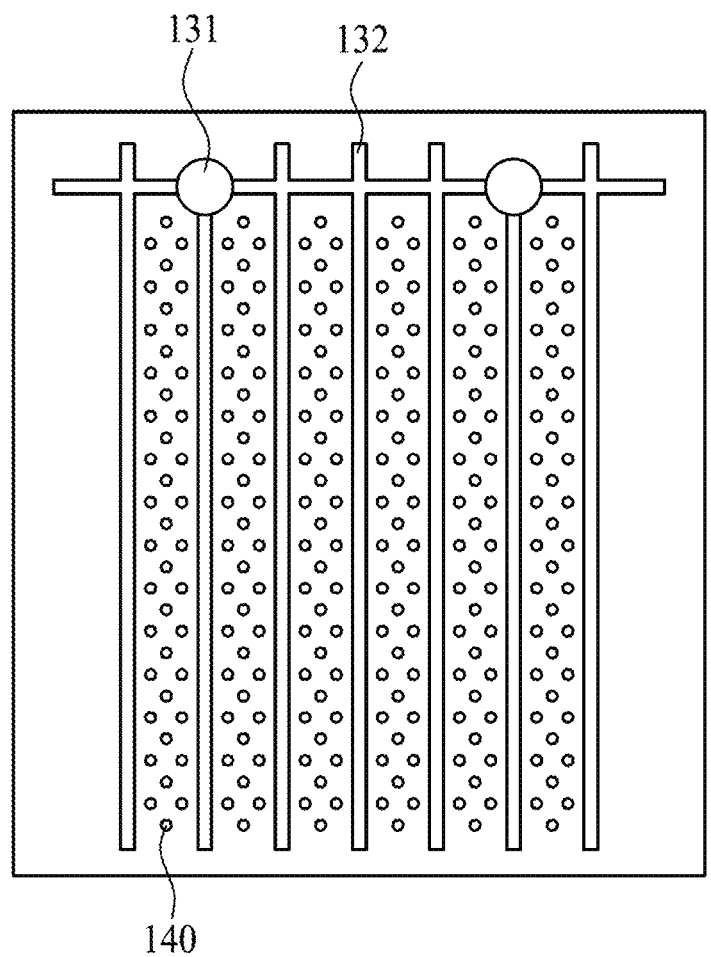
FIG. 6 shows a top-view of the optoelectronic device in FIG. 5E.

Subsequent to the step of removing the substrate 101 and therefore exposing the first surface of the first window layer 111 as shown in FIG. 1C, a second ohmic contact layer 140 formed of conductive material like GeAu or BeAu alloy is formed on the first surface of the first window layer 111, as shown in FIG. 5A, wherein the second ohmic contact layer 140 comprises a plurality of dots that are arranged between any two fingers 132 which are parallel to each other and is preferred not substantially overlapped with the first ohmic contact layer 130 in vertical direction as shown in FIG. 6 so the current spreading is enhanced. As FIG. 6 shows, the pattern of the second ohmic contact layer 140 is aligned with the pattern of the first ohmic contact layer 130. Each of the plurality of dots has at least one bevel. The thickness of each of the dots is about 1000 Å~10000 Å, and preferably is about 2000 Å~6000 Å. A second alloying process is then performed at an alloying temperature of around 300~500° C. or more for forming an ohmic contact between the second ohmic contact layer 140 and the first window layer 111. The detail of the alloying process is well-known to those skilled in this field, and not necessarily disclosed herein.

Figure 5B:
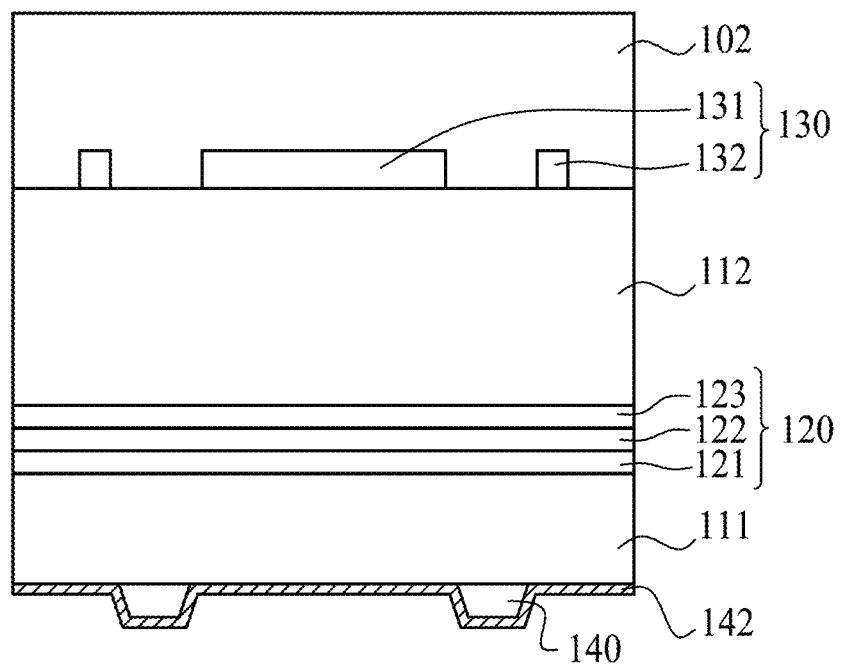

As shown in FIG. 5B, an insulating layer 142 is formed by e-gun or PECVD to conformably cover the second ohmic contact layer 140 and the first surface of the first window layer 111, wherein the insulating layer 142 is formed of insulating material with refractive index about 1.3~1.6, such as $SiO_x$ or $MgF_2$. The refractive index of the insulating layer 142 is at least 1.5 lower than that of the first window layer 111. The thickness of the insulating layer 142 is about 500 Å~5000 Å, and preferably is about 500 Å~1000 Å. The thickness of the insulating layer 142 is smaller than that of the second ohmic contact layer 140.

Figure 5C:
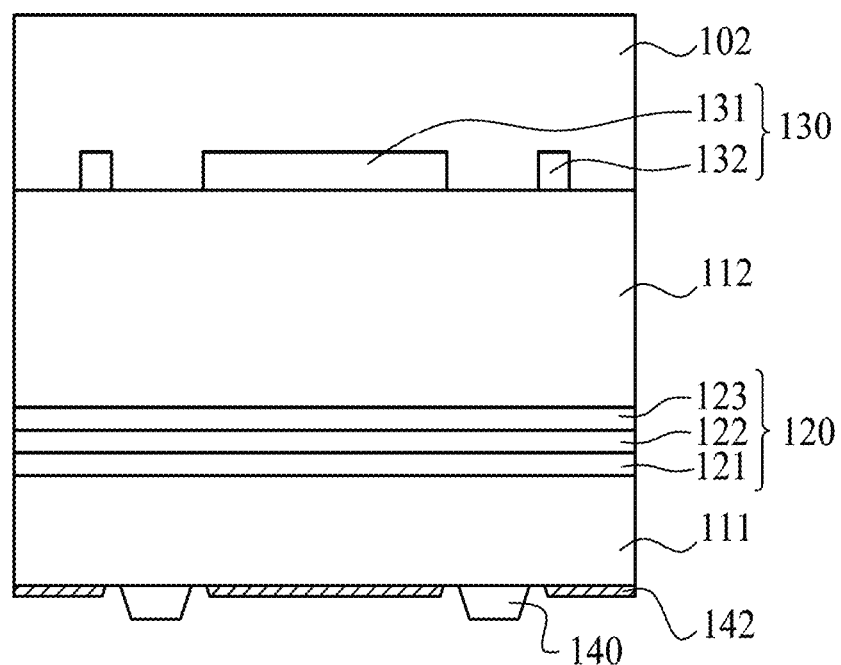

Next, as shown in FIG. 5C, the insulating layer 142 is regionally etched by dry etching, such as RIE, or wet etching, such as BOE (buffer oxide etch), to expose the second ohmic contact layer 140. After the etching, a portion of the first surface of the first window layer 111 can be exposed, too. The pattern of the contact layer is complementary to the pattern of the insulating layer.

Figure 5D:
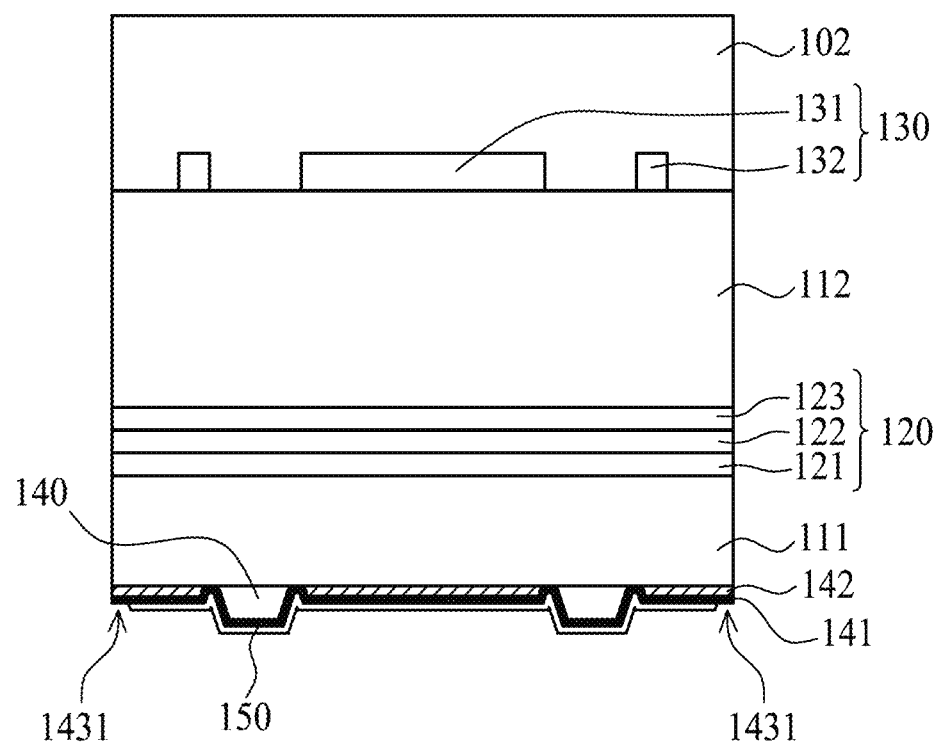

Next, as shown in FIG. 5D, a transparent conductive layer 141 is formed to cover the insulating layer 142 and the second ohmic contact layer 140, wherein the material of the transparent conductive layer 141 comprises metal oxide, such as at least one material selected from the group consisting of indium tin oxide (ITO), cadmium tin oxide (CTO), antimony tin oxide, indium zinc oxide, zinc aluminum oxide, and zinc tin oxide; and the thickness is about 50 Å~150 Å. Then, a reflecting layer 150 is formed on the transparent conductive layer 141, wherein the material of the reflecting layer 150 comprises metal, such as Ag and the thickness is about 2500 Å~7500 Å. The reflecting layer 150 dose not reach the border of the transparent conductive layer 141 and reveals the border region 1431 of the transparent conductive layer 141. In the embodiment, the transparent conductive layer 141 is served as an adhesion layer for improving the adhesion between the reflecting layer 150 and the insulating layer 142.

Figure 5E:
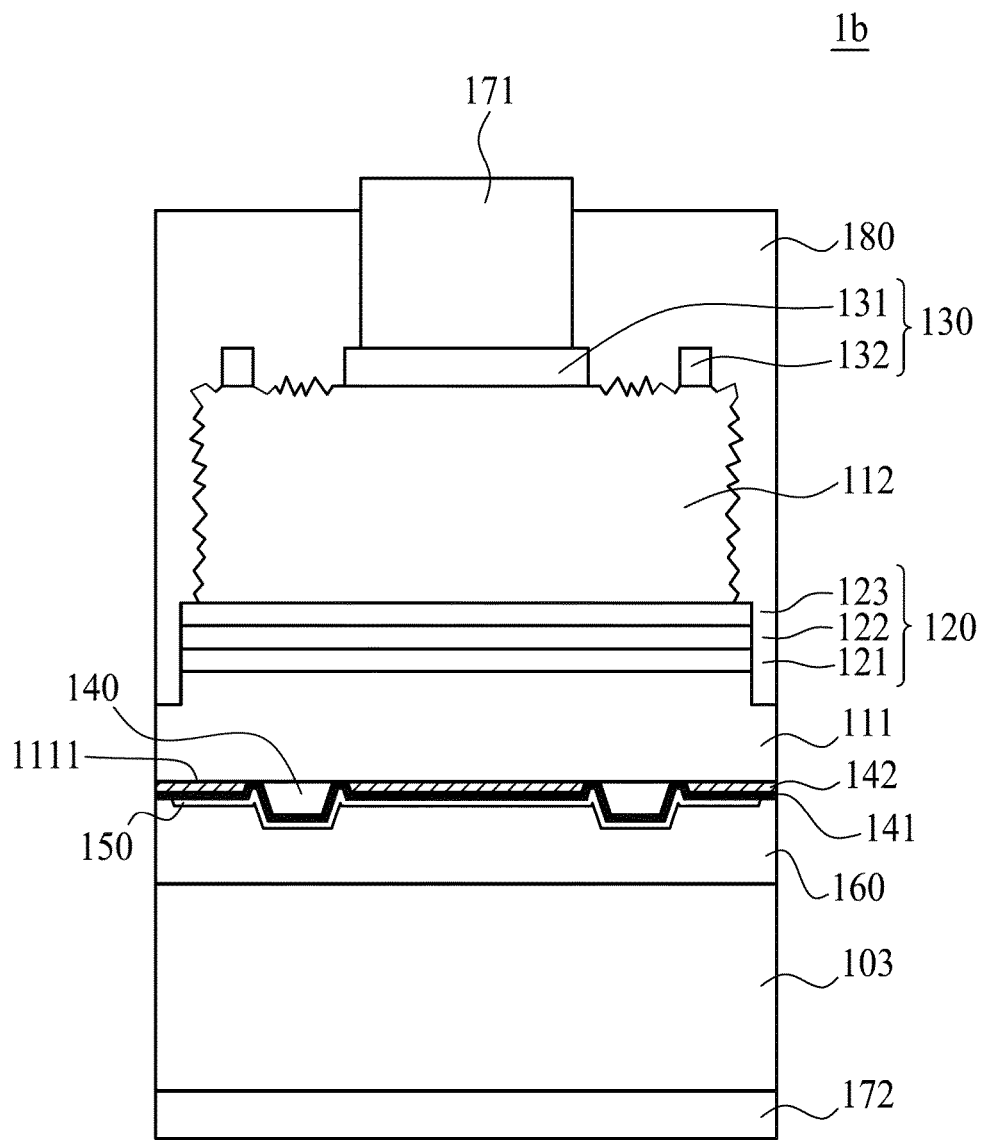

Then, the reflecting layer 150 is bonded to a supporting substrate 103 by a metal layer 160 and the following process is the same as aforementioned embodiment. The final structure of the optoelectronic device 1b is shown in FIG. 5E. The reflecting layer 150 reveals the border region 1431, so a portion of the transparent conductive layer 141 is able to connect to the metal layer 160. In this embodiment, the supporting substrate 103 comprises Si, and the metal layer 160 served as a bonding layer comprises one material selected from the group consisting of In, Au, Sn, Pb, InAu, SnAu, and the alloy thereof. In the embodiment, the insulating layer 142 is capable of preventing the reflecting layer 150 from migrating to the first window layer 111 or the optoelectronic system 120 when an electrical current flows through the reflecting layer 150. The insulating layer 142 is also served as a current blocking. When the electrical current flows through the surface 1111, the electrical current can be blocked by the insulating layer 142 and passes through mainly the second ohmic contact layer 140. In the embodiment, the insulating layer 142 is disposed between the first window layer 111 and the reflecting layer 150, and since the difference of the refractive index between the first window layer 111 and the insulating layer 142 is larger than 1.5, the first window layer 111, the insulating layer 142 and the reflecting layer 150 are able to form an omnidirectional reflector (ODR) for reflecting the light emitted from the conversion unit 122. The reflectivity of the omnidirectional reflector (ODR) is larger than 95%, and preferably is larger than 97%.

FIGS. 7A to 7D show a method of manufacturing an optoelectronic device in accordance with third embodiment of the present disclosure.

Figure 7A:
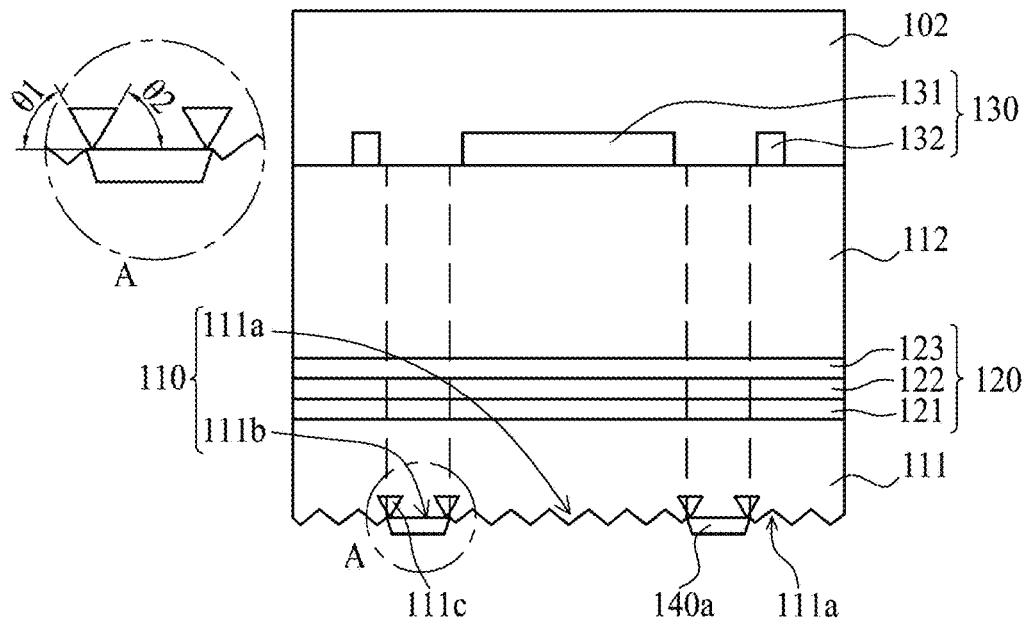
FIGS. 7A to 7E show the corresponding structures fabricated by the manufacturing method step-by-step in accordance with the third embodiment of the present disclosure.

The method incorporates the steps as disclosed in FIGS. 1A~1C and the descriptions thereof. Subsequent to the step of removing the substrate 101 and therefore exposing the first surface of the first window layer 111 as shown in FIG. 1C, a second ohmic contact region 140a is formed on the first surface 110 of the first window layer 111 as shown in FIG. 7A. The second ohmic contact region 140a comprises a plurality of dots formed of electrically conductive material like GeAu alloy or BeAu alloy and arranged between two of fingers 132 parallel to each other as shown in FIG. 6. The second ohmic contact region 140a is not overlapped with the first ohmic contact layer 130 in vertical direction for enhancing the current spreading performance. Each of the plurality of dots has one bevel. The thickness of each of the dots is about 10 Å~10000 Å, and preferably is about 50 Å~6000 Å. Then, a second alloying process is performed at an alloying temperature of around 300~500° C. or more for forming an ohmic contact between the second ohmic contact region 140a and the first window layer 111. The detail of the alloying process is well-known to those skilled in this field, and not necessarily disclosed herein.

Figure 7B:
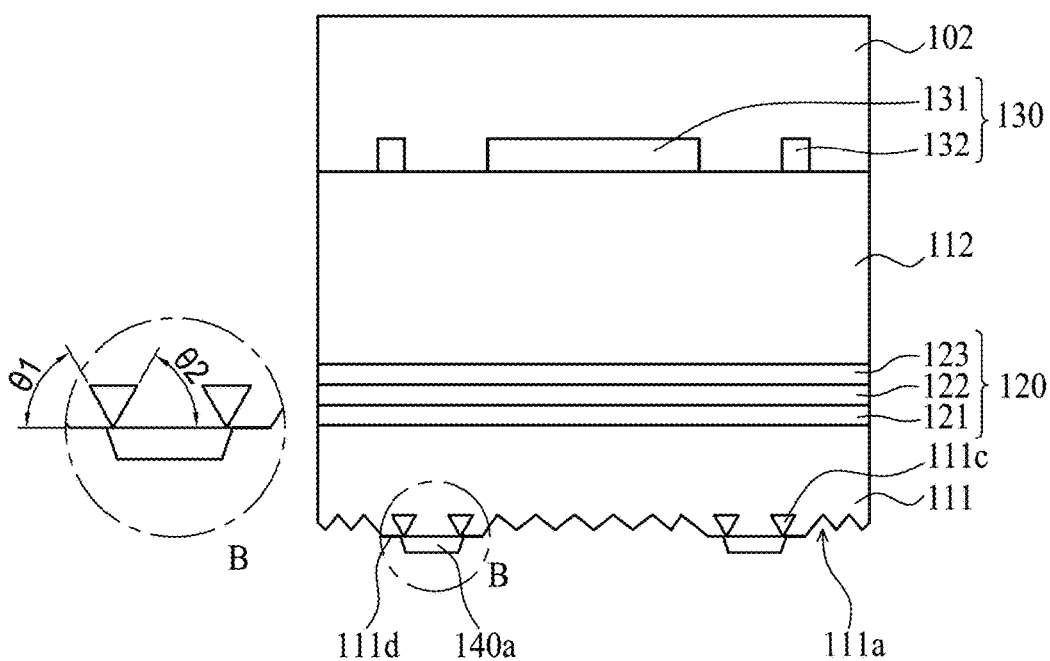
Figure 7C:
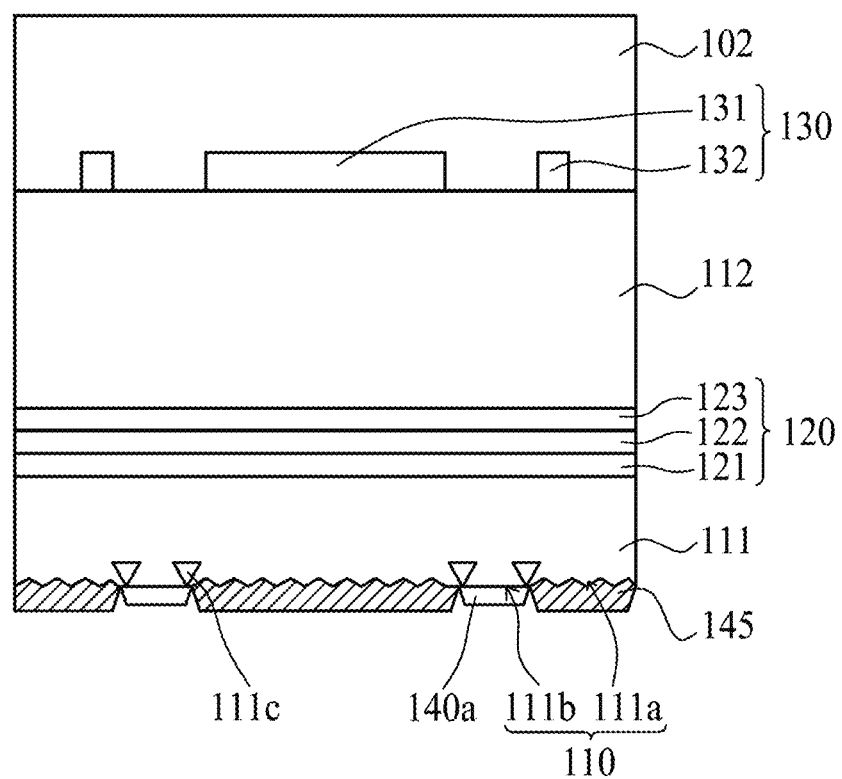
Figure 7D:
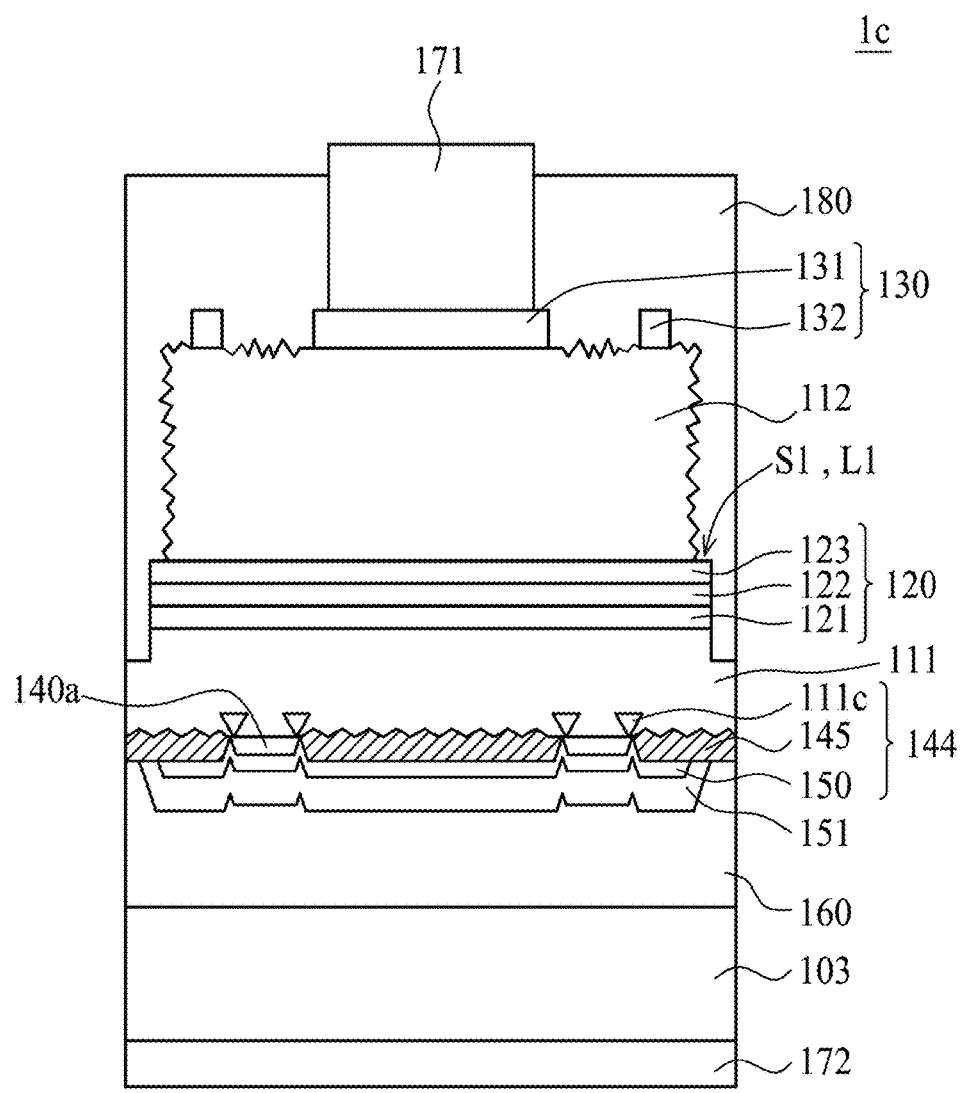
Figure 7E:
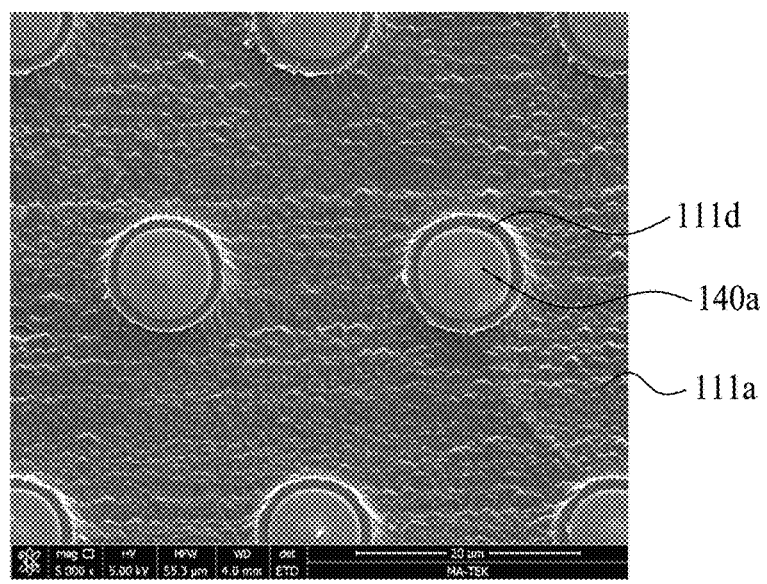

The first surface 110 of the first window layer 111 has a first portion 111a exposed by the second ohmic contact region 140a and a second portion 111b contacting the second ohmic contact region 140a. Then, the first portion 111a of the first surface 110 is roughened by wet etching process using the second ohmic contact region 140a as a mask such that the first portion 111a has a first roughness (Ra) during 0.1 μm and 0.5 μm for scattering the light emitted from the conversion unit 122. The wet etching solution used for the wet etching process comprises an acid solution, such as HCl, $H_3PO_4$ or the combination thereof. In another embodiment, as shown in FIG. 7B, after roughening the first portion 111a of the first surface 110, a platform 111d is formed directly under each of the plurality of dots of the second ohmic contact region 140a, and the area of the dot is smaller than that of the platform 111d. The platform 111d has substantially the same shape as the dot 111d. The platform and the dot thereon are concentric. The platform 111d comprises a peripheral region not covered by the dot wherein the peripheral region has a smaller roughness (Ra) than that of the first portion 111a as shown in FIG. 7E, which is an SEM top-view image showing the topography of the roughened first portion 111a, the platforms 111d and the plurality of the dots of the second ohmic contact region 140a. During the wet etching process, the etching solution penetrates into the first window layer 111 approximately at the border 140a of the second ohmic contact region 140a to thereby form a void 111c in the first window layer 111 and surrounds the second ohmic contact region 140a as shown in FIG. 7C. The void 111c has a shrinking opening connecting to the border of the second ohmic contact region 140a. The cross-section of the void 111c is substantially a triangle or a triangle-like shape and one vertex of the triangle connects to the border of the second ohmic contact region 140a. Each of the edges of the triangle is smaller than 2 μm and two angles $\theta_1$ and $\theta_2$ between the two edges and the first surface 110 respectively are different. The void 111c contains air therein. In another embodiment, the cross-sectional shape of the void 111c comprises an oval.

As shown in FIG. 7C, the method further comprises forming a transparent layer 145 on the first portion 111a and not covering the second ohmic contact region 140a. During forming the transparent layer 145, the material of the transparent layer 145 may partially deposit into the void 111c through the shrinking opening of the void 111c. The pattern of the transparent layer 145 is complementary to the pattern of the second ohmic contact region 140a from the top view of the optoelectronic device 1c as shown in FIG. 7D. The thickness of the transparent layer 145 is between 0.05 μm and 2.5 μm, and preferably has the same thickness as the second ohmic contact region 140a. The difference between a thickness of the transparent layer 145 and that of the second ohmic contact region 140a is preferably smaller than 1 μm for reducing the height between the surface of the transparent layer 145 and the second ohmic contact region 140a. The transparent layer 145 comprises insulating transparent material with a refractive index small than 2, such as $SiN_x$, $AlO_x$, $SiO_x$ or $MgF_x$, or conductive transparent oxide material with a refractive index small than 2.2, such as indium tin oxide (ITO), cadmium tin oxide (CTO), antimony tin oxide, indium zinc oxide (IZO), zinc aluminum oxide (AZO), and zinc tin oxide. The refractive index of the transparent layer 145 is different from that of the void 111c, and the refractive indices of the void 111c and the transparent layer 145 are both at least 1.0 lower than that of the first window layer 111 for improving the light-extraction efficiency of the conversion unit 122.

As shown in FIG. 7D, the method further comprises forming a reflecting layer 150 conformably covering the second ohmic contact region 140a and the transparent layer 145 for forming an omnidirectional reflecting structure 144. Since the void 111c embeds air having a refractive index about 1 and the refractive index difference between the void 111c and the first window layer 111 is larger than 2, the omnidirectional reflecting structure 144 provides a reflectivity larger than 90% for the light emitted from the conversion unit 122, and preferably larger than 95%. Before forming the reflecting layer 150, the method optionally comprises flattening the transparent layer 145 for further enhancing the reflectivity of the omnidirectional reflecting structure 144. The thickness of the reflecting layer 150 is between 0.1 μm and 1 μm, and preferably is between 0.3 μm and 0.5 μm. The material of the reflecting layer 150 comprises Ag, Au or Al. Then, a barrier layer 151 is formed to conformably cover the reflecting layer 150 for preventing the material of the reflecting layer 150 from migrating when an operating current flows through the reflecting layer 150 and therefore deteriorate the reflectivity of the reflecting layer 150 and the reliability of the optoelectronic device. The thickness of the barrier 151 is between 0.5 μm and 5 μm, and preferably is between 0.5 μm and 1.5 μm. The material of the barrier layer 151 comprises Ni, Ti, Pt, Au or the combination thereof.

Then the barrier 151 is bonded to a supporting substrate 103 by a metal layer 160. In one embodiment, the supporting substrate 103 comprises Si, and the metal layer 160 served as a bonding layer comprises at least one material selected from the group consisting of In, Au, Sn, Pb, InAu, SnAu, and the alloy thereof. The subsequent steps of the method are very similar to or the same as the steps as described in FIGS. 1F~1H the descriptions thereof, the entirety of which are incorporated into the present embodiment. For example, the temporary substrate 102 is removed to expose the first ohmic contact layer 130 and the second window layer 112, and therefore forming a stack structure. Then the stack structure is patterned by the lithographic-etching process to form a plurality of chip areas (not shown) on the supporting substrate 103, wherein the etchants of the etching process, e.g. dry-etching chemicals comprising fluoride or chloride etch the second window layer 112 relatively faster than the optoelectronic system 120 such that a first mesa region S1 is formed on the surface of the optoelectronic system 120 or the second layer 123, and the width of the optoelectronic system 120 or the second layer 123 is larger than the width of the second window layer 112 at the interface of the optoelectronic system 120 or the second layer 123 and the second window layer 112. It can also be noted that a second mesa region S2 is formed on the surface of the first window layer 111, and the bottom width of the first window layer 111 is larger than the optoelectronic system 120 or the first layer 121. Next, at least the exposed top and sidewall surfaces of the second window layer 112 is wet etched such that the exposed top and sidewall surfaces of the second window layer 112 are roughened, wherein the etching solution, such as a mixture of hydrofluoric acid (HF), nitric acid ($HNO_3$), and acetic acid ($CH_3COOH$), etches the second window layer 112 relatively faster than the optoelectronic system 120 such that the width difference L1 is further expanded and become larger, and the second window layer 112 has an enhanced surface roughness higher than that of the optoelectronic system 120, and wherein the width difference L1 is greater than 1 micron and/or less than 10 microns as indicated in FIG. 7D or FIG. 3. Finally, a first pad 171 is formed on the first ohmic contact layer 130, a second pad 172 is formed on the supporting substrate 103, and a passivation layer 180 covers the second window layer 112 and the first ohmic contact layer 130 to form the optoelectronic device 1c in accordance with the present disclosure as shown in FIG. 2. The passivation layer 180 serves as a protection layer to protect the optoelectronic device from environment damage, such as moisture, or mechanical damage.

FIG. 7D shows an optoelectronic device 1c with the omnidirectional reflecting structure 144 in accordance with the present disclosure. The optoelectronic device 1c comprises the first window layer 111, the optoelectronic system 120 on a second surface of the first window layer 111, the second window layer 112 on a first surface of the optoelectronic system 120, the second ohmic contact region 140a on the first surface of the first window layer 111, the omnidirectional reflecting structure 144 on the second ohmic contact region 140a and the first surface of the first window layer 111, the barrier 151 completely covering the omnidirectional reflecting structure 144, the metal layer 160 bonding the supporting substrate 103 and the barrier 151, the first ohmic contact layer 130 on the second window layer 112, the first pad 171 on the first ohmic contact layer 130, the second pad 172 on the supporting substrate 103, and the passivation layer 180 covering the second window layer 112 and the first ohmic contact layer 130. The optoelectronic system 120 includes at least the first layer 121 having a first conductivity-type, the conversion unit 122, and the second layer 123 having a second conductivity-type. The omnidirectional reflecting structure 144 includes the void 111c in the first window layer 111 and surrounding the second ohmic contact region 140a, the transparent layer 145 on the first surface of the first window layer 112 not covered by the second ohmic contact region 140a, the reflecting layer 150 conformably covering the second ohmic contact region 140a and the transparent layer 145.

The first window layer 111 is made of a material containing at least one element selected from the group consisting of Al, Ga, In, As, P, and N, such as GaN, AlGaInP or any other suitable materials. The second window layer 112 comprises at least one material different from the second layer 123, and is preferred a layer with a conductivity-type the same as the second layer 123, such as a p-type GaP layer. The first mesa region S1 is on the surface of the optoelectronic system 120 or the second layer 123, and the width of the optoelectronic system 120 or the second layer 123 is larger than the width of the second window layer 112 at the interface of the optoelectronic system 120 or the second layer 123 and the second window layer 112. The second mesa region S2 is on the surface of the first window layer 111, and the bottom width of the first window layer 111 is larger than the optoelectronic system 120 or the first layer 121. The top and sidewall surfaces of the second window layer 112 are roughened such that the second window layer 112 has an enhanced surface roughness higher than that of the optoelectronic system 120. The width difference L1 between the optoelectronic system 120 and the first window layer 111 is greater than 1 micron and/or less than 10 microns. The second ohmic contact region 140a having a plurality of dots ohmically contacts with the first window layer 111 and reveals the first portion 111a. The first portion 111a is roughened to have a first roughness (Ra) during 0.1 μm~0.5 μm for scattering the light emitted from the conversion unit 122. The shrinking opening of the void 111c connects to the border 140a of the second ohmic contact region 140a. The cross-section of the void 111c is substantially a triangle or a triangle-like shape and one vertex of the triangle connects to the border 140a. The pattern of the transparent layer 145 on the first portion 111a is complementary to the pattern of the second ohmic contact region 140a from the top view of the optoelectronic device 1c. The refractive index of the transparent layer 145 is different from that of the void 111c, and the refractive indices of the void 111c and the transparent layer 145 are both at least 1.0 lower than that of the first window layer 111 for improving the light-extraction efficiency of the conversion unit 122. The reflecting layer 150 conformably covers the second ohmic contact region 140a and the transparent layer 145 for forming an omnidirectional reflecting structure 144. Since the void 111c embeds air having a refractive index about 1 and the refractive index difference between the void 111c and the first window layer 111 is larger than 2, the omnidirectional reflecting structure 144 provides a reflectivity larger than 95% for the light emitted from the conversion unit 122, and preferably larger than 97%. Before forming the reflecting layer 150, the transparent layer 145 is flatted for further enhancing the reflectivity of the omnidirectional reflecting structure 144. The thickness of the reflecting layer 150 is between 0.1 μm~1 μm, and preferably is between 0.3 μm~0.5 μm. The thickness of the barrier 151 completely covering the reflecting layer 150 is between 0.5 μm~5 μm, and preferably is between 0.5 μm~1.5 μm such that the barrier 151 is able to prevent the reflecting layer 150 from migrating.

Figure 8:
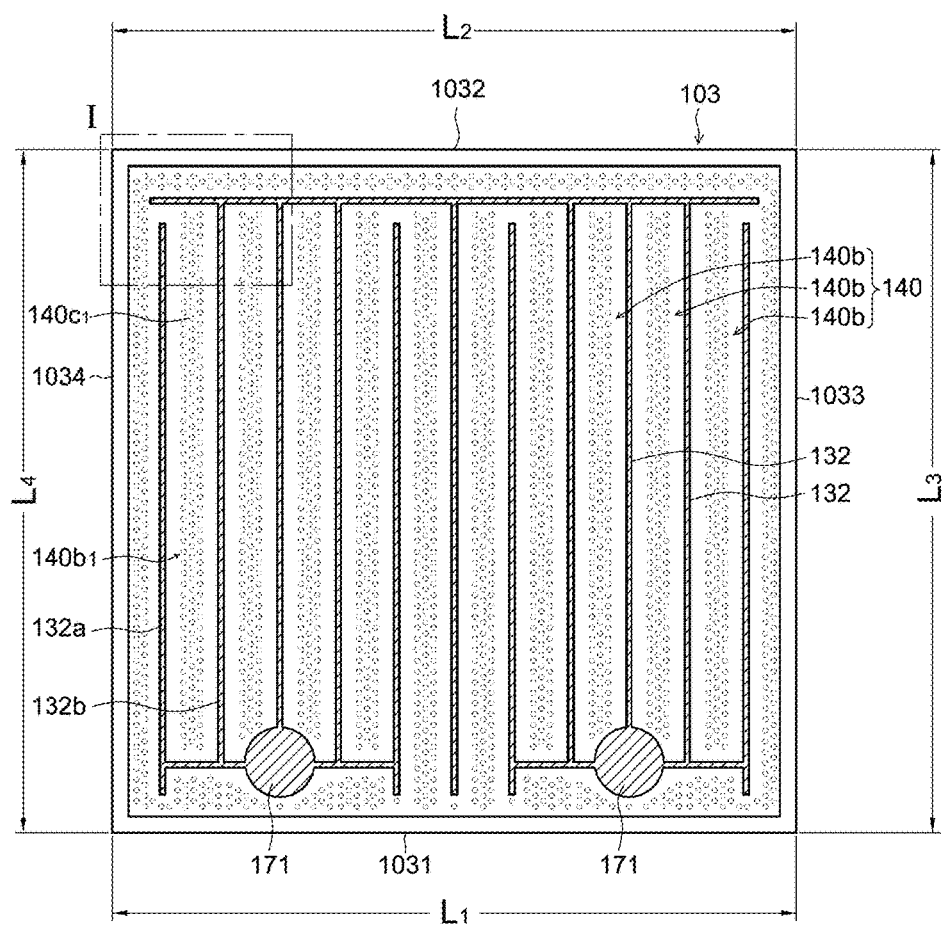
FIG. 8 illustrates a top view of an optoelectronic device in accordance with the fourth embodiment of the present disclosure.
Figure 9A:
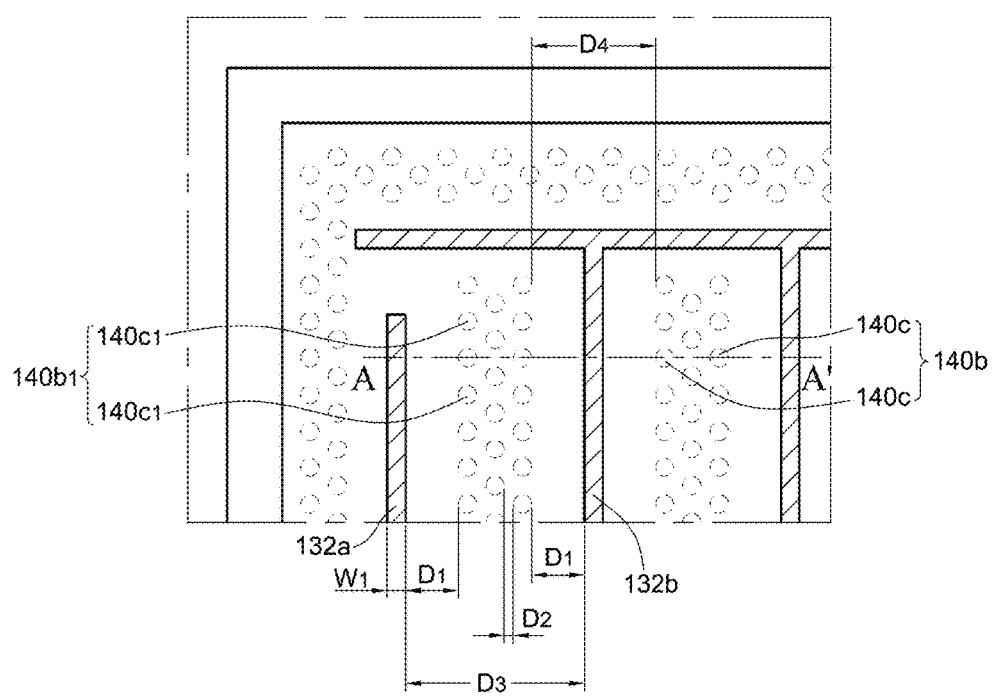
FIG. 9A shows an enlarged detail of region I in FIG.8.
Figure 9B:
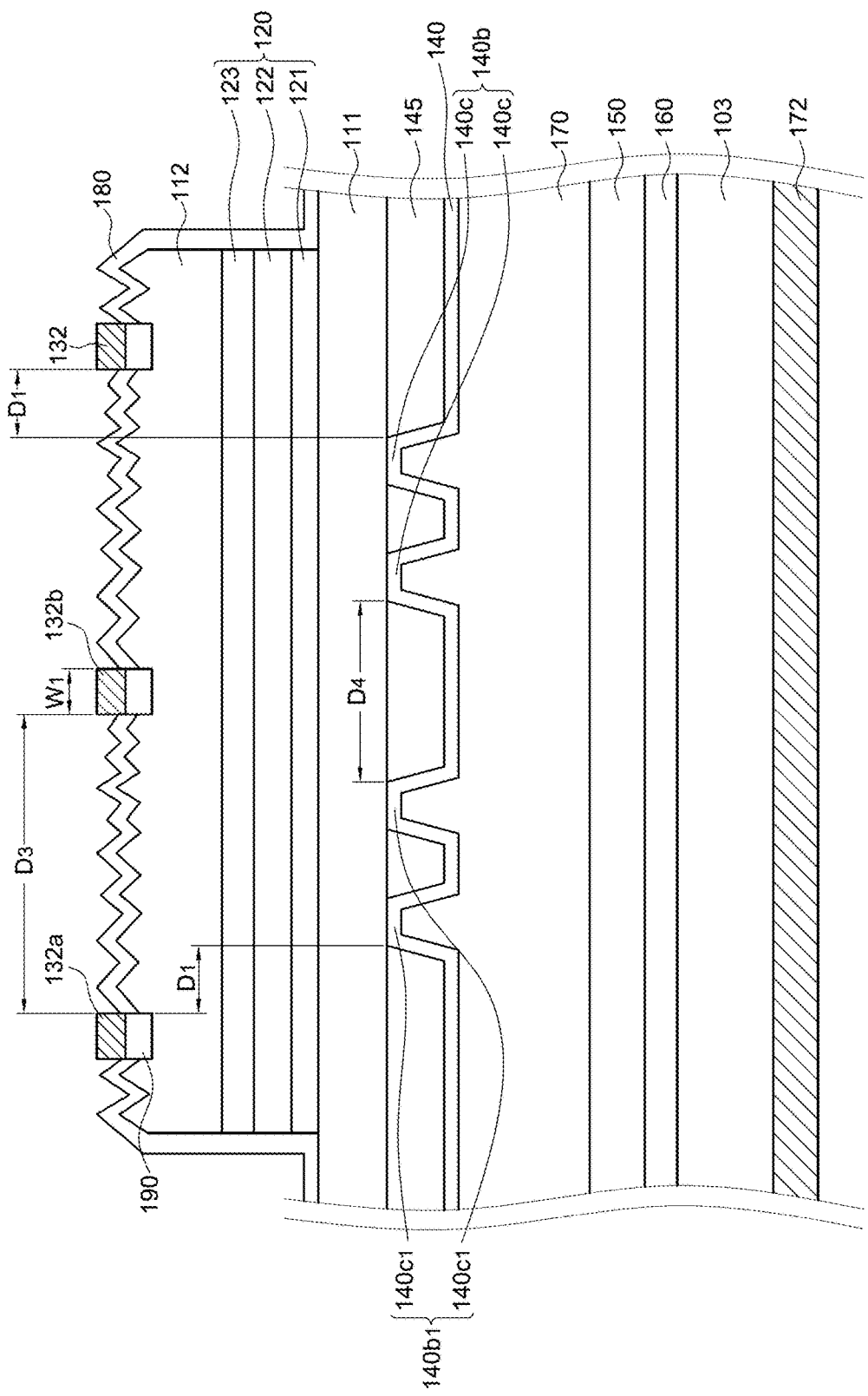
FIG. 9B is a cross-sectional diagram along an A-A' line of the optoelectronic device shown in FIG. 9A.

FIG. 8 illustrates a top view of an optoelectronic device in accordance with the fourth embodiment of the present disclosure. FIG. 9A shows an enlarged detail of region I in FIG. 8. FIG. 9B is a cross-sectional diagram along an A-A' line of the optoelectronic device shown in FIG. 9A. The optoelectronic device in accordance with the fourth embodiment of the present disclosure comprises substantially the same structure as the third embodiment, and the difference is as follows. The supporting substrate 103 comprises a first side 1031 having a first length $L_1$, a second side opposite to the first side and having a second length $L_2$, a third side and a fourth side between the first side and the second side, wherein the third side has a third length $L_3$, and the fourth side has a fourth length $L_4$. The optoelectronic device comprises two first pads 171 and multiple fingers 132 extending from the first pads 171 toward at least one of the sides of the supporting substrate 103. In the present embodiment, the first pads 171 are nearer the first side 1031 than the second side 1032. At least one of the multiple fingers 132 extends from the first pads 171 toward the second side 1032, wherein the finger 132 is substantially parallel to the third side 1033 and the fourth side 1034. Referring to FIG. 9B, multiple recesses are formed in the transparent layer 145 and are separated to one another. Therefore, the pattern of the recesses is complementary to the pattern of the transparent layer 145. The second ohmic contact layer 140 is formed conformably on the transparent layer 145 and filled in the multiple recesses. The part of the second ohmic contact layer 140 directly in contact with a first semiconductor layer 111, which is the window layer 111 in the present embodiment, forms an ohmic contact with the first window layer 111, and thus forms multiple contact regions 140b. The thickness of the transparent layer 145 is about 500 Å~5000 Å, and preferably is about 1000 Å~2000 Å. The multiple contact regions 140b are separated from one another. The contact regions 140b do not overlap any of the fingers in vertical direction. As shown in FIG. 9A, a first contact region $140b_1$ in the multiple contact regions 140b is between two adjacent fingers 132a,132b in the multiple fingers 132, and a first distance $D_1$ between the first contact region $140b_1$ and one of the adjacent fingers 132a is between 0.8% and 5%, and preferably, between 1% and 3% of one of the lengths of the substrate. Preferably, the other adjacent fingers 132b and the contact region $140b_1$ are separated by the first distance $D_1$ as well. In the present embodiment, the first length $L_1$, the second length $L_2$, the third length $L_3$ and the fourth length $L_4$ are substantially the same, for example, between about 1055 and 1090 μm. In one embodiment, the shape of the supporting substrate 103 is rectangle. Therefore, the first length $L_1$ is substantially the same as the second length $L_2$, and the third length $L_3$ is substantially the same as the fourth length $L_4$. An angle between one of the fingers 132 and the first side 1031 or the second side 1032 is between 85 degrees and 95 degrees. In the present embodiment, the first distance $D_1$ is between 10 μm and 30 μm, and preferably, between 13 μm and 26 μm. The shape of the supporting substrate 103 is not limited to the present embodiment. In the present disclosure, each finger 132 has a longer side and a shorter side compared to the longer side, and a width w1 of the shorter side is between 3 μm and 12 μm, and preferably, between 4 μm and 6 μm. The pattern or the shape of the fingers is not limited to the present embodiment, for example, one of the fingers may be a curve or an annular, and the finger and the closest contact region is spaced apart by the first distance $D_1$.

In the present embodiment, each contact region 140b comprises multiple contact areas 140c separated from one another and arranged in multiple columns along a direction parallel to one of the two adjacent fingers 132. In the present embodiment, the multiple contact areas $140c_1$ in the first contact region $140b_1$ are arranged in three columns along the direction parallel to the two adjacent fingers 132a, 132b. Specifically, the contact areas $140c_1$ are arranged in a staggered pattern. A second distance $D_2$ between two adjacent columns in the multiple columns of the first contact region $140b_1$ is shorter than the first distance $D_1$. The second distance $D_2$ is between 3 μm and 10 μm, and preferably, between 4 μm and 7 μm. Preferably, a ratio of the second distance $D_2$ to the first distance $D_1$ is between 0.1 and 0.7, and preferably between 0.15 and 0.55. More preferably, a difference between the second distance $D_2$ and the first distance $D_1$ is between 3 μm and 25 μm, and preferably between 6 μm and 22 μm.

In the present embodiment, as shown in FIG. 8, the shape of each contact area 140c is circle and is substantially the same as one another. However, the shape of the contact area 140c is not limited to the present embodiment. The contact area 140c has a width between 5 μm and 15 μm, and preferably, between 7 μm and 10 μm. In the present embodiment, the width is the diameter of the circle. In the present embodiment, each interval between two adjacent contact areas 104c in the same column is substantially the same as one another, for example, between 5 μm and 15 μm, and preferably, between 5 μm and 10 μm. In one embodiment, each interval between two adjacent contact areas 140c in the adjacent columns respectively is substantially the same as one another. The arrangement of the contact areas 104c is not limited to the present embodiment, for example, one of the intervals between two adjacent contact areas 140c in the same column or in the adjacent columns respectively can be different from those of the others, the width of one of the contact areas 140c can be different from those of the others and/or the number of the columns can be changed.

In one embodiment, the second ohmic contact layer 140 comprises transparent conducive oxide material comprising indium tin oxide (ITO), indium oxide (InO), tin oxide (SnO), cadmium tin oxide (CTO), antimony tin oxide (ATO), aluminium zinc oxide (AZO), zinc tin oxide (ZTO), gallium doped zinc oxide (GZO), tungsten doped indium oxide (IWO), zinc oxide (ZnO), or indium zinc oxide (IZO). In the present embodiment, the second ohmic contact layer 140 comprises indium tin oxide (ITO). The second ohmic contact layer 140 has a thickness not less than 20 Å, and preferably, not greater than 2000 Å, and more preferably, not greater than 200 Å.

In one embodiment, the optoelectronic device further comprises a current spreading layer 170 between the reflecting layer 150 and the second ohmic contact layer 140. The material of the current spreading layer 170 comprise transparent conductive oxide material comprising indium tin oxide (ITO), aluminum zinc oxide (AZO), SnCdO, antimony tin oxide (ATO), ZnO, $Zn_2SnO_4$ (ZTO) or indium zinc oxide (IZO). The current spreading layer 170 has a thickness between 1000 Å and 5000 Å, and preferably between 1500 Å and 3500 Å. The material of the current spreading layer 170 can be the same or different from the material of the second ohmic contact layer 140. Preferably, the material of the current spreading layer 170 is different from the material of the second ohmic contact layer 140. In the present embodiment, the current spreading layer 170 comprises IZO.

Figure 10:
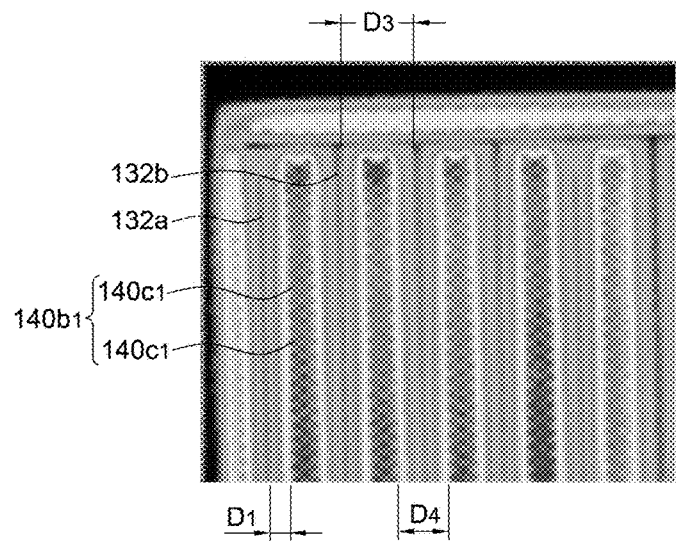
FIG. 10 shows a near field image of a part of the optoelectronic device shown in FIG. 8.

FIG. 10 shows a near field image of a part of the optoelectronic device shown in FIG. 8. As shown in FIG. 10, the light is concentrated more substantially around the area where the contact regions 140b are located. Therefore, the light is less likely to be hindered by the fingers 132.

In one embodiment, the first distance $D_1$ between the first contact region $140b_1$ and one of the adjacent fingers 132a is between 5% and 50%, and preferably, between 10% and 40%, and more preferably, between 10% and 25% of a third distance D3 between the two adjacent fingers. In the present embodiment, the third distance $D_3$ is between 60 μm and 150 μm, and preferably, between 70 μm and 130 μm. Specifically, the third distance $D_3$ is between 5% and 15%, and more preferably, between 6% and 13% the first length $L_1$ of the substrate.

In one embodiment, a first finger 132b in the multiple fingers 132 is between two of the adjacent contact regions 140b, and a fourth distance $D_4$ between the two adjacent contact regions 140b is between 0.8% and 8%, and preferably, between 1.5% and 6% of one of the length of the substrate. Preferably, the fourth distance $D_4$ between the two adjacent contact regions 140b is between 0.8% and 8%, and preferably, between 1.5% and 6% of the first length L1 of the first side 1031 or the second length $L_2$ of the second side 1032. In the present embodiment, the fourth distance $D_4$ is between 10 μm and 70 μm, and preferably, between 20 μm and 60 μm.

Figure 11:
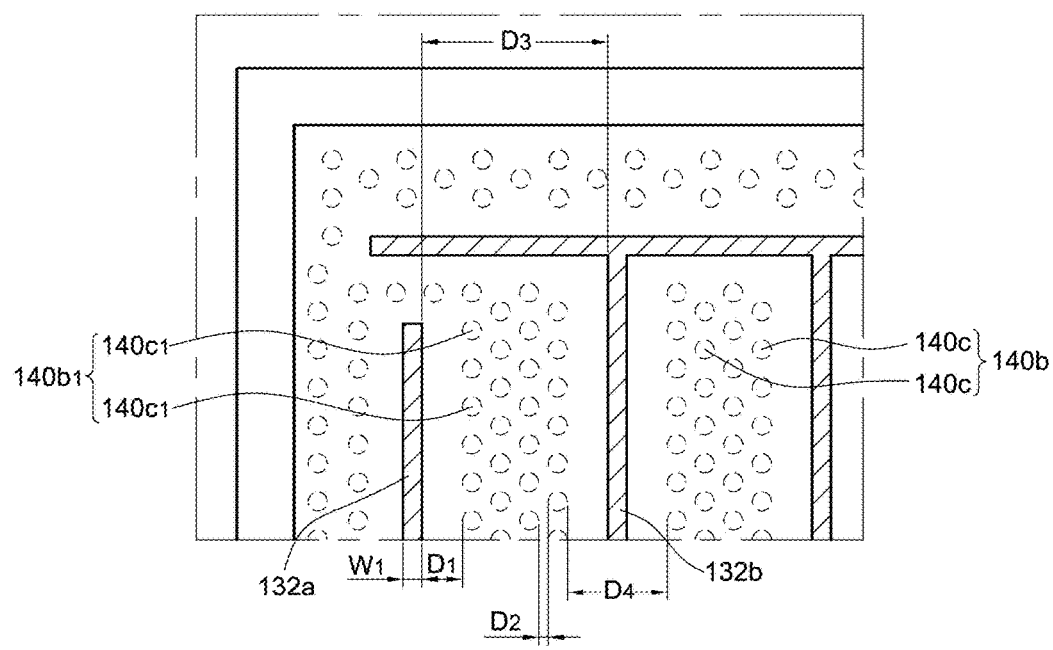
FIG. 11 shows another enlarged detail of region I in accordance with the fifth embodiment of the present disclosure.

FIG. 11 shows another enlarged detail of region I in accordance with the fifth embodiment of the present disclosure. An optoelectronic device in accordance with the fifth embodiment of the present disclosure comprises substantially the same structure as the fourth embodiment, and the difference is that the multiple contact areas 140c in at least one of the contact regions 140b are arranged in four columns along the direction parallel to the two adjacent fingers 132a, 132b.

Figure 12A:
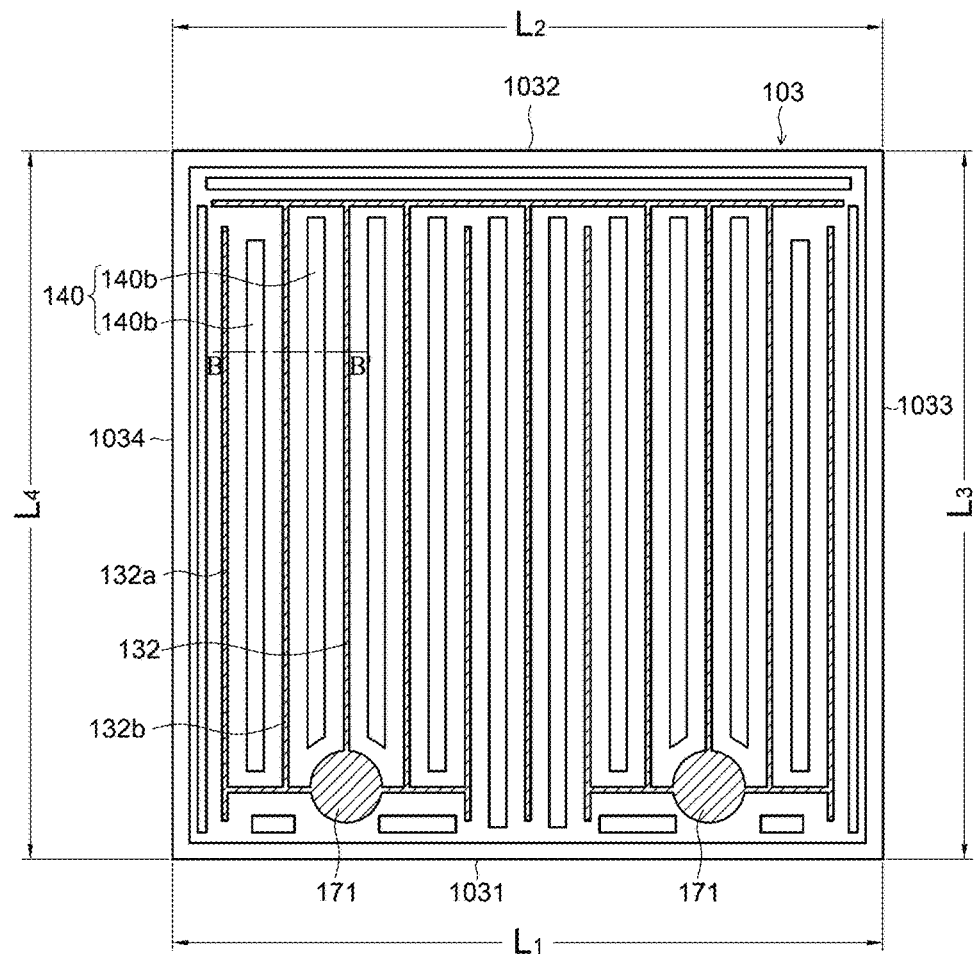
FIG. 12A illustrates a top view of an optoelectronic device in accordance with the sixth embodiment of the present disclosure.
Figure 12B:
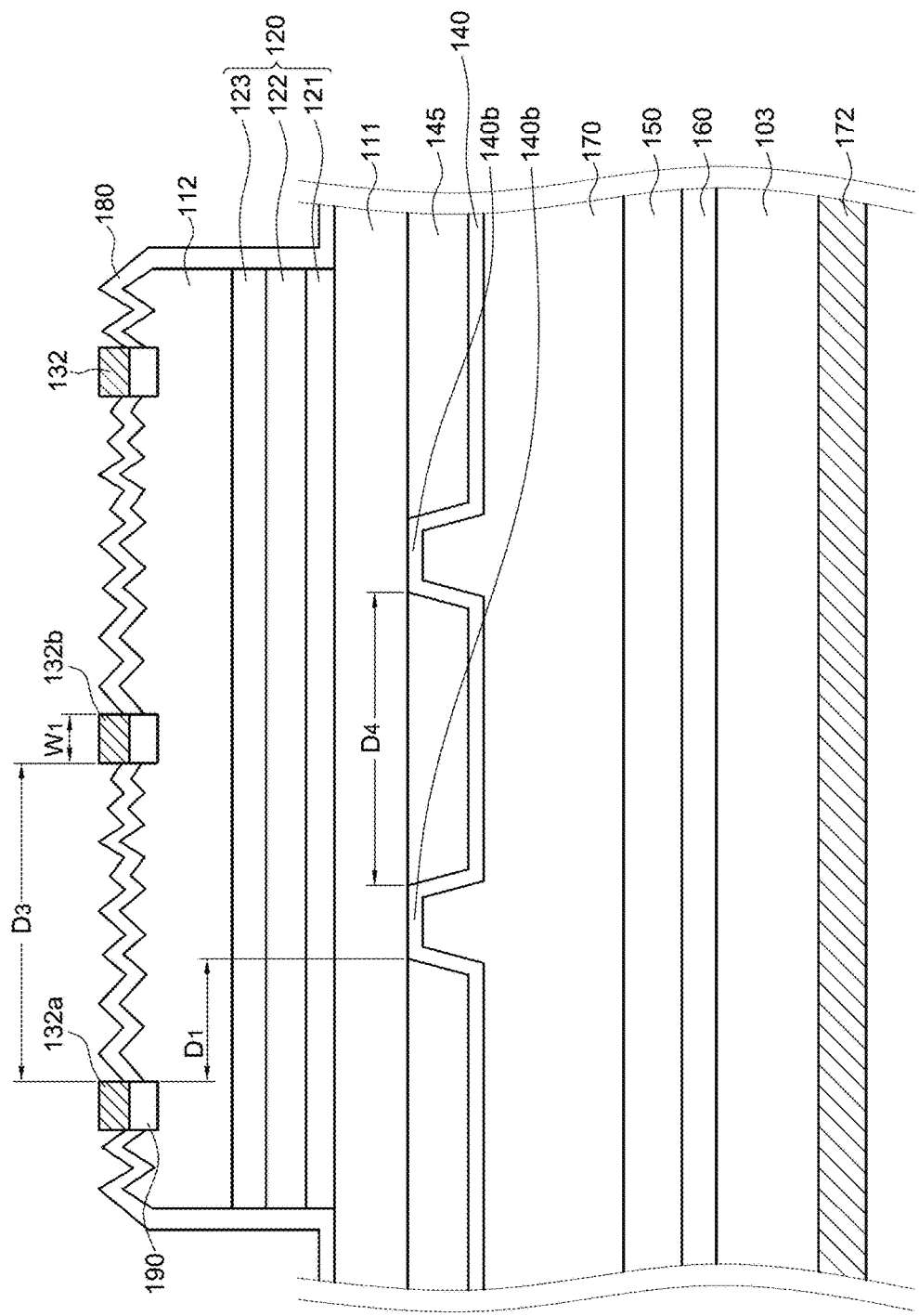
FIG. 12B is a cross-sectional diagram along a B-B' line of the optoelectronic device shown in FIG. 12A.

FIG. 12A illustrates a top view of an optoelectronic device in accordance with the sixth embodiment of the present disclosure. FIG. 12B is a cross-sectional diagram along a B-B' line of the optoelectronic device shown in FIG. 12A. The optoelectronic device in accordance with the sixth embodiment of the present disclosure comprises substantially the same structure as the fourth embodiment, and the difference is that the each contact region 140b is a continuous structure without comprising multiple contact areas 140c as mentioned in the fourth embodiment, wherein the contact regions 140b are separated from one another. In the present embodiment, the shape of each contact region 140b is quadrangle and extending along a direction parallel to the two adjacent fingers 132. The shape of the contact region 140b is not limited to the present embodiment, for example, the shape of the contact region can be circle.

In one embodiment, the first window layer 111 has the same conductivity-type as the first layer 121, such as p-type. The second window layer 112 is a layer comprising n-type $(Al_xGa_{(1-x)})_{0.5}In_{0.5}P$ where x is near or substantially equal to 1.

Compared to a conventional optoelectronic device, the optoelectronic device of the present disclosure has a higher radiant power. Specifically, the radiant power of the optoelectronic device of the present disclosure has increased by near 10% compared to a conventional optoelectronic device.

In one embodiment, the optoelectronic device is devoid of the first window layer 111 between the first layer 121 and the transparent layer 145. The optoelectronic device further comprises a first semiconductor contact layer (not shown) between the first layer 121 and the transparent layer 145. The conductivity type of the first semiconductor contact layer is the same as that of the first layer 121. In one embodiment, the first semiconductor contact layer is p-type and has a high p-type impurity concentration, such as greater than $10\times^{17}/cm^3$, and preferably, greater than $10\times^{18}/cm^3$, and more preferably, between $1\times10^{19}/cm^3$ and $5\times10^{22}/cm^3$ both inclusive. The material of the contact layer comprises a Group III-V semiconductor material, such as GaP. In the present embodiment, the first semiconductor contact layer is the first semiconductor layer to be in contact with the second ohmic contact layer 140. The first semiconductor contact layer has a thickness between 10 nm and 100 nm, and preferably between 10 nm and 60 nm. In one embodiment, the optoelectronic device further comprises a buffer layer (not shown) between the first layer 121 and the first semiconductor layer. The buffer layer has a bandgap smaller than that of the first layer 121. Preferably, the content of Al in the buffer layer is less than that of the first layer 121. More preferably, the buffer layer comprises $(Al_yGa_{(1-y)})_{1-x}In_xP$, wherein $0≤x≤1$, $0≤y≤1$, and preferably, $0.49≤x≤0.51$, $0≤y≤0.5$. In the present embodiment, the first layer 121 comprises $(Al_yGa_{(1-y)})_{1-x}In_xP$, wherein x is near or substantially equal to 1. The buffer layer has a thickness between 30 nm and 200 nm, and preferably, between 30 nm and 100 nm. The buffer layer is for preventing the first layer 121 from being damaged during the manufacturing process. Specifically, a distance between the first layer 121 and the transparent layer 145 is between 40 nm and 400 nm, and preferably between 60 nm and 200 nm, and more preferably, between 60 nm and 100 nm. The radiant power of the optoelectronic device of the present embodiment has increased by near 5% compared to the optoelectronic device of the fourth embodiment.

In one embodiment, the optoelectronic device further comprises a second semiconductor contact layer 190 between the fingers 132 and the second window layer 112. The second semiconductor contact layer 190 has a pattern substantially the same as the pattern of the fingers 132. The fingers 132 forms a low specific contact resistance or an ohmic contact with the second semiconductor contact layer 190, wherein the specific contact resistance between the fingers 132 and the second semiconductor contact layer 190 is lower than $10^{-2}$ ohm(Ω)cm², and preferably, lower than $10^{-4}$ Ωcm². Specifically, the second semiconductor contact layer 190, which is the first semiconductor layer directly contacting the fingers 132, is for reducing the resistance across the fingers 132 comprising metal and the second semiconductor contact layer 190 such that the forward voltage of the optoelectronic device is less than $1.3×1240/λ$ (volt), wherein λ is the peak wavelength. The conductivity type of the second semiconductor contact layer 190 is the same as that of the second window layer 112. In one embodiment, the second semiconductor contact layer 190 is n-type and has a high n-type impurity concentration, such as greater than $10×10^{18}$/cm3, and preferably, greater than $10×10^{19}$/cm³, and more preferably, between $1×10^{19}$/cm³ and $5×10^{22}$/cm³ both inclusive. The material of the contact layer comprises a Group III-V semiconductor material, such as GaAs, AlGaAs.

The first pad 171 and the second pad 172 are for electrically connected to an external power source and for conducting a current therebetween. The first pad 171, the second pad 172 and/or the fingers 132 may further comprise a layer comprising transparent conductive material or metal material, wherein the transparent conductive material comprises transparent conductive oxide, and wherein the metal material comprises Au, Pt, GeAuNi, Ti, BeAu, GeAu, Al, or ZnAu, Ni.

In one embodiment, the second ohmic contact layer 140 in FIG. 2 and in FIG. 5E and the second ohmic contact region 140a in FIG. 7D can have substantially the same arrangement as that of the contact regions 140b as shown in FIG. 8 or FIG. 12A.

In the present disclosure, if not specifically mention, the general expression of AlGaAs means $Al_xGa_{(1-x)}As$, wherein $0≤x≤1$; the general expression of AlInP means $Al_xIn_{(1-x)}P$, wherein $0≤x≤1$; the general expression of AlGaInP means $(Al_yGa_{(1-y)})_{1-x}In_xP$, wherein $0≤x≤1$, $0≤y≤1$; the general expression of AlGaN means $Al_xGa_{(1-x)}N$, wherein $0≤x≤1$; the general expression of AlAsSb means $AlAs_{(1-x)}Sb_x$ wherein $0≤x≤1$ and the general expression of InGaP means $In_xGa_{1-x}P$, wherein $0≤x≤1$. The content of the element can be adjusted for different purposes, such as, but not limited to, adjusting the energy gap or adjusting the peak wavelength or the dominant wavelength.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

Although the drawings and the illustrations above are corresponding to the specific embodiments individually, the element, the practicing method, the designing principle, and the technical theory can be referred, exchanged, incorporated, collocated, coordinated except they are conflicted, incompatible, or hard to be put into practice together.

Although the present application has been explained above, it is not the limitation of the range, the sequence in practice, the material in practice, or the method in practice. Any modification or decoration for present application is not detached from the spirit and the range of such.

What is claimed is:

1. An optoelectronic device comprising:
   a substrate comprising a first side having a first length;
   a first contact layer on the substrate; and
   a second contact layer between the substrate and the first contact layer,
   wherein the second contact layer is not overlapped with the first contact layer in a vertical direction,
   wherein the second contact layer comprises multiple contact regions separated from each other and arranged in a two-dimensional array, and
   wherein a first distance between the two adjacent contact regions is between 0.8% and 8% of the first length.

2. The optoelectronic device of claim 1, wherein the first distance between the two adjacent contact regions is between 1.5% and 6% of the first length of the substrate.

3. The optoelectronic device of claim 1, further comprising multiple fingers on the first contact layer opposite to the multiple contact regions.

4. The optoelectronic device of claim 3, wherein a first contact region of the contact regions is between two adjacent fingers of the multiple fingers.

5. The optoelectronic device of claim 4, wherein a second distance between the first contact region and one of the adjacent fingers is between 5% and 50% of a third distance between the two adjacent fingers.

6. The optoelectronic device of claim 4, wherein a second distance between the first contact region and one of the adjacent fingers is between 10% and 40% of a third distance between the two adjacent fingers.

7. The optoelectronic device of claim 4, wherein a second distance between the first contact region and one of the adjacent fingers is between 10% and 25% of a third distance between the two adjacent fingers.

8. The optoelectronic device of claim 5, wherein the third distance is between 5% and 15% of the first length.

9. The optoelectronic device of claim 5, wherein the third distance is between 6% and 13% of the first length.

10. The optoelectronic device of claim 5, wherein the third distance is between 60 μm and 150 μm both inclusive.

11. The optoelectronic device of claim 5, wherein the second distance is between 10 μm and 30 μm both inclusive.

12. The optoelectronic device of claim 4, wherein a second distance between the first contact region and one of the adjacent fingers is between 0.8% and 5% of the first length.

13. The optoelectronic device of claim 4, wherein a second distance between the first contact region and one of the adjacent fingers is between 1% and 3% of the first length.

14. The optoelectronic device of claim 3, wherein one of the fingers is a curve or an annular.

15. The optoelectronic device of claim 4, wherein the first contact region comprises multiple contact areas arranged in multiple columns, and a second distance between two adjacent columns is shorter than a third distance between the first contact region and one of the adjacent fingers.

16. The optoelectronic device of claim 15, wherein the second distance between two adjacent columns is between 3 μm and 10 μm both inclusive.

17. The optoelectronic device of claim 15, wherein a ratio of the second distance to the third distance is between 0.1 and 0.7 both inclusive.

18. The optoelectronic device of claim 15, wherein, a difference between the second distance and the third distance is between 3 μm and 25 μm both inclusive.

19. The optoelectronic device of claim 15, wherein one of the contact areas has a width between 5 μm and 15 μm both inclusive.

20. The optoelectronic device of claim 1, wherein the first distance is between 10 μm and 70 μm both inclusive.

\* \* \* \* \*